(12) United States Patent
Ichiryu et al.

(10) Patent No.: US 8,617,943 B2
(45) Date of Patent: Dec. 31, 2013

(54) METHOD FOR MAKING A SEMICONDUCTOR DEVICE ON A FLEXIBLE SUBSTRATE

(75) Inventors: Takashi Ichiryu, Osaka (JP); Seiichi Nakatani, Osaka (JP); Koichi Hirano, Osaka (JP); Yoshihisa Yamashita, Kyoto (JP); Shingo Komatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 315 days.

(21) Appl. No.: 12/746,440

(22) PCT Filed: Jul. 22, 2009

(86) PCT No.: PCT/JP2009/003440
§ 371 (c)(1),
(2), (4) Date: Jun. 4, 2010

(87) PCT Pub. No.: WO2010/032355
PCT Pub. Date: Mar. 25, 2010

(65) Prior Publication Data
US 2010/0276691 A1 Nov. 4, 2010

(30) Foreign Application Priority Data
Sep. 18, 2008 (JP) .................. 2008-239121

(51) Int. Cl.
*H01L 21/00* (2006.01)
(52) U.S. Cl.
USPC ............... 438/158; 438/51; 438/61; 438/104; 257/43; 257/59; 257/72; 257/359

(58) Field of Classification Search
USPC ........ 257/43, 59, 72, 359, E33.001, E21.598; 438/51, 61, 104, 149, 155
See application file for complete search history.

(56) References Cited

U.S. PATENT DOCUMENTS

| 2004/0029364 | A1 | 2/2004 | Aoki et al. | |
|---|---|---|---|---|
| 2004/0046172 | A1* | 3/2004 | Lee et al. | 257/66 |
| 2008/0044953 | A1* | 2/2008 | Yang et al. | 438/129 |
| 2010/0012936 | A1 | 1/2010 | Hirano et al. | |

FOREIGN PATENT DOCUMENTS

| JP | 2003-258261 | 9/2003 |
|---|---|---|
| JP | 2003-318120 | 11/2003 |

(Continued)

*Primary Examiner* — Mark A Laurenzi
(74) *Attorney, Agent, or Firm* — McDermott Will & Emery LLP

(57) ABSTRACT

A method for fabricating a flexible semiconductor device includes: preparing a layered film 80 including a first metal layer 10, an inorganic insulating layer 20, a semiconductor layer 30, and a second metal layer 40 which are sequentially formed; etching the first metal layer 10 to form a gate electrode 12g; compression bonding a resin layer 50 to a surface of the layered film 80 provided with the gate electrode 12g to allow the gate electrode 12g to be embedded in the resin layer 50; and etching the second metal layer 40 to form a source electrode 42s and a drain electrode 42d, wherein the inorganic insulating layer 20 on the gate electrode 12g functions as a gate insulating film 22, and the semiconductor layer 30 between the source electrode 42s and drain electrode 42d on the inorganic insulating layer 20 functions as a channel 32.

12 Claims, 20 Drawing Sheets

(56) References Cited

FOREIGN PATENT DOCUMENTS

| | | |
|---|---|---|
| JP | 2005-123290 | 5/2005 |
| JP | 2005-166742 | 6/2005 |
| JP | 2005-294300 | 10/2005 |
| JP | 2006-186294 | 7/2006 |
| JP | 2007-067263 | 3/2007 |
| JP | 2007-073857 | 3/2007 |
| WO | WO 2009/069248 A1 | 6/2009 |

* cited by examiner

FIG.3
(a) 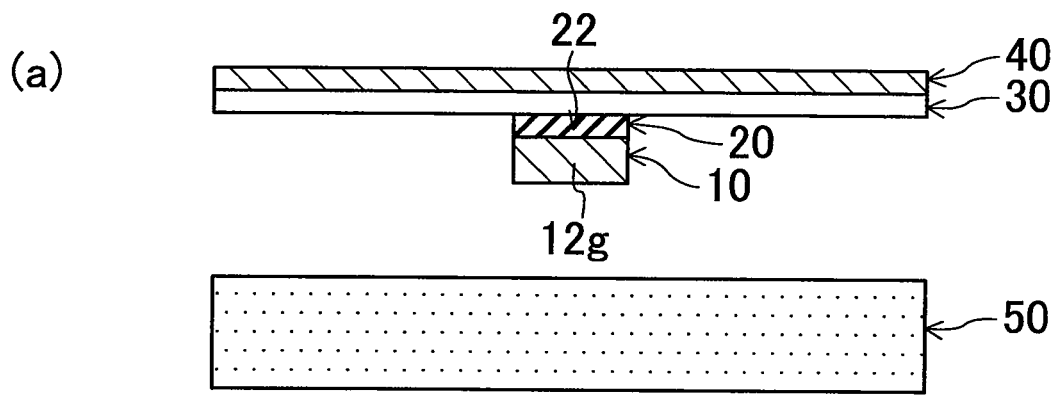
(b) 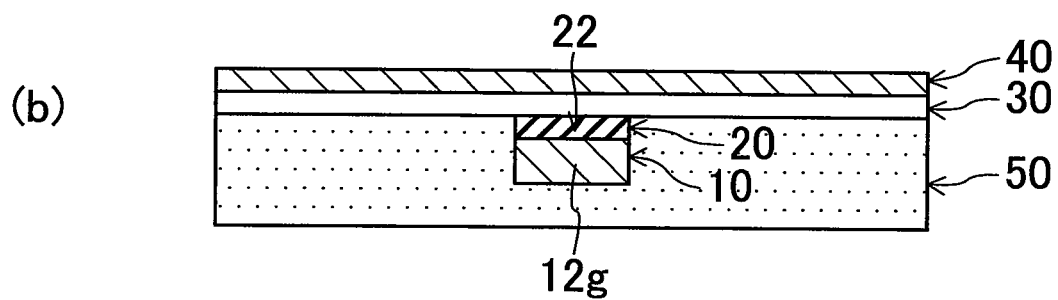
(c) 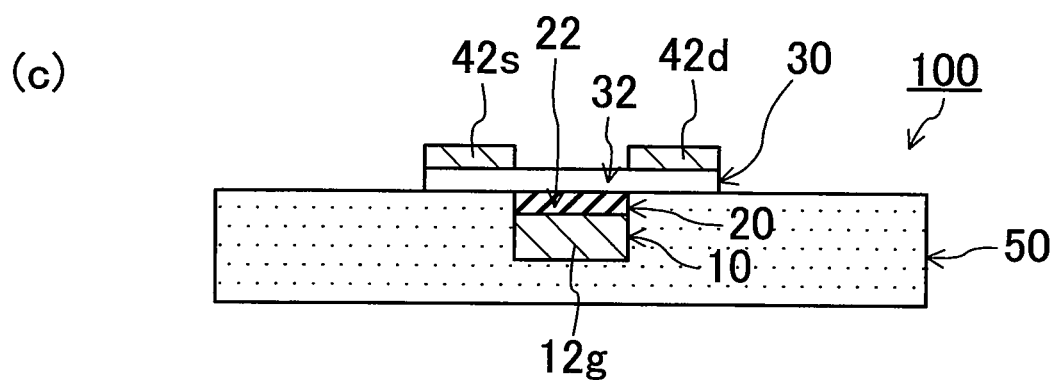

FIG.4
(a)
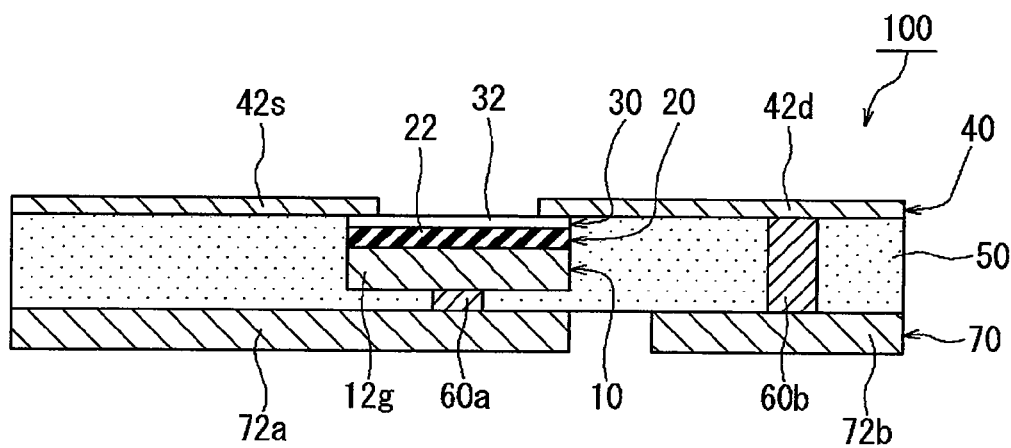
(b)
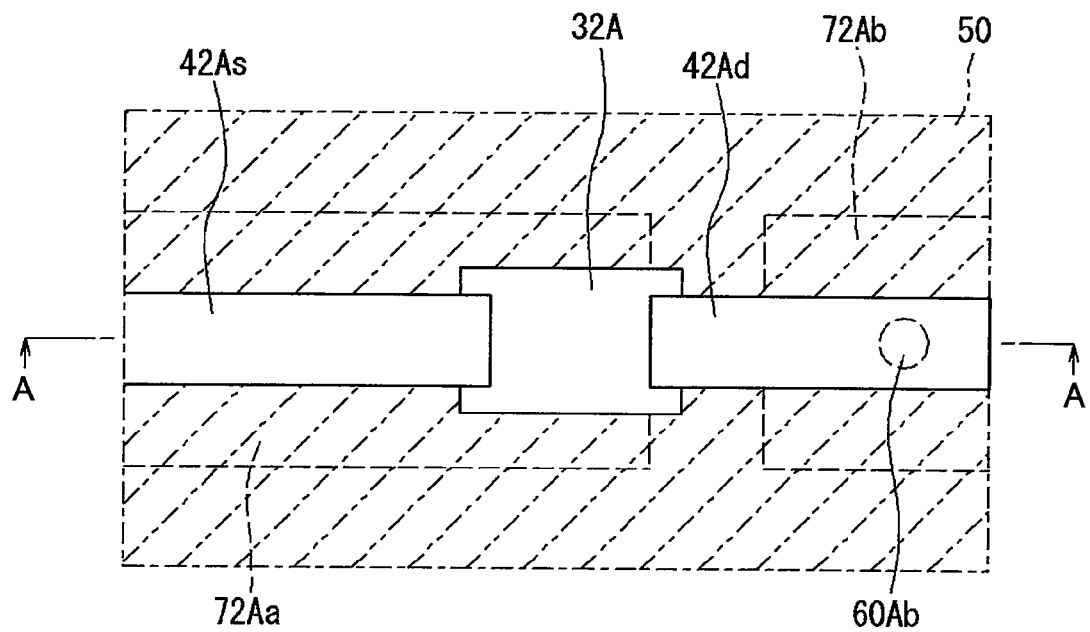

FIG.6
(a) 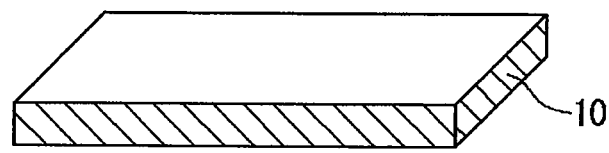
(b) 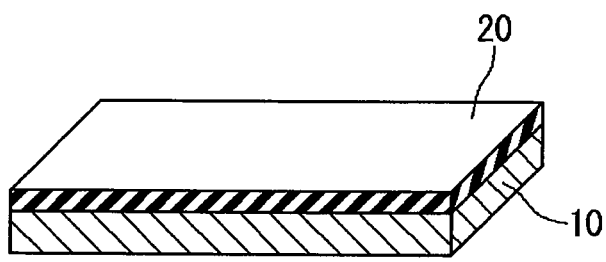
(c) 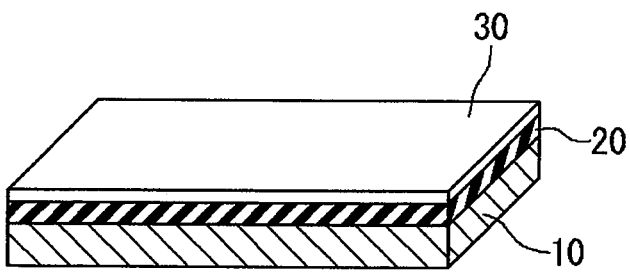
(d) 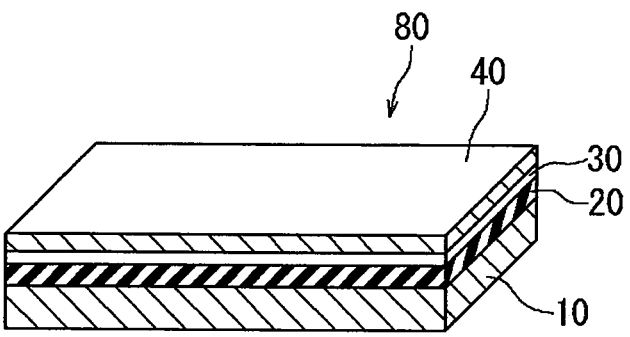

FIG.12
(a)
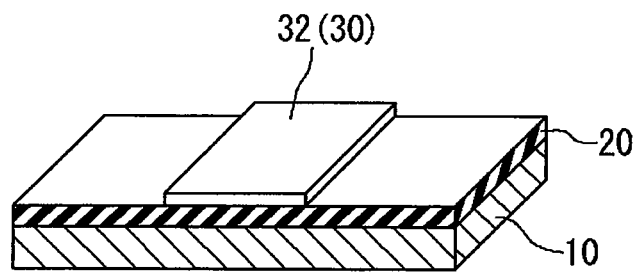
(b)
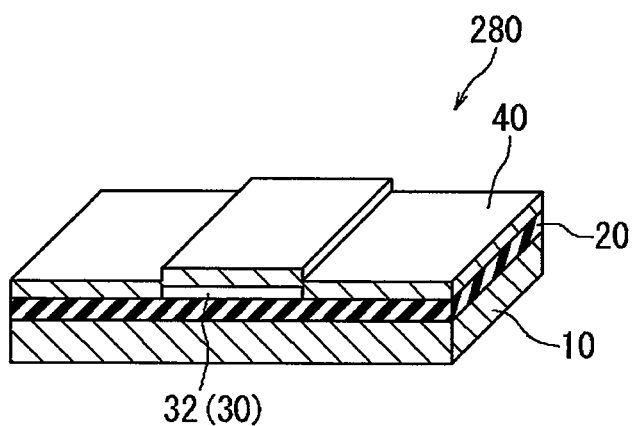

FIG. 19
(a)
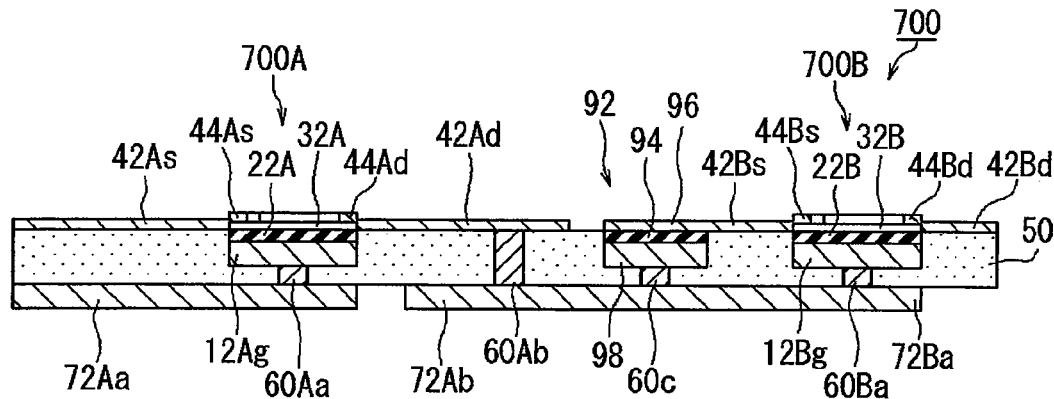
(b)
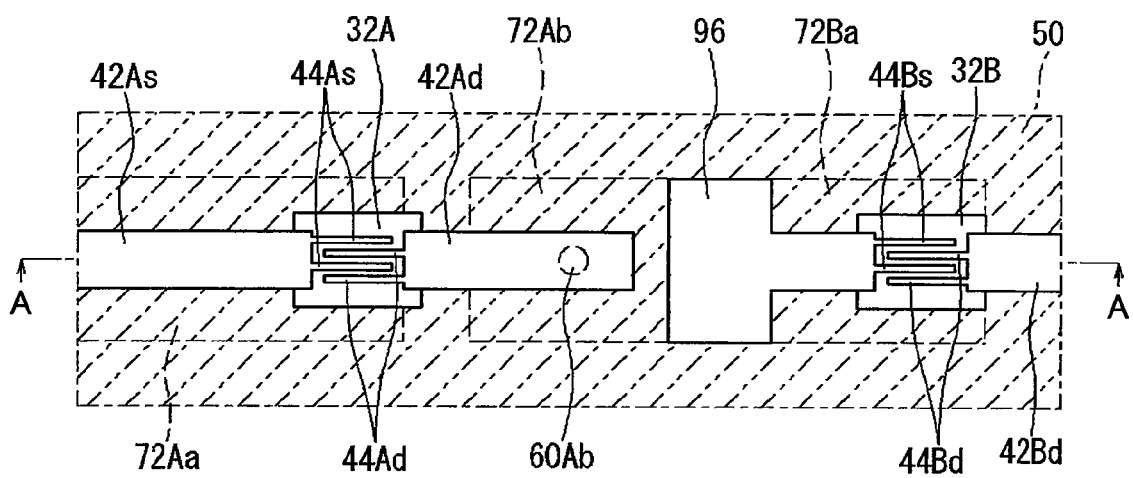
(c)
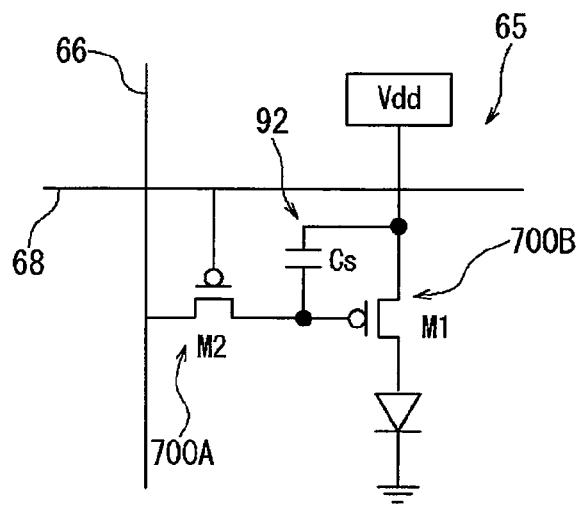

FIG. 20
(a)
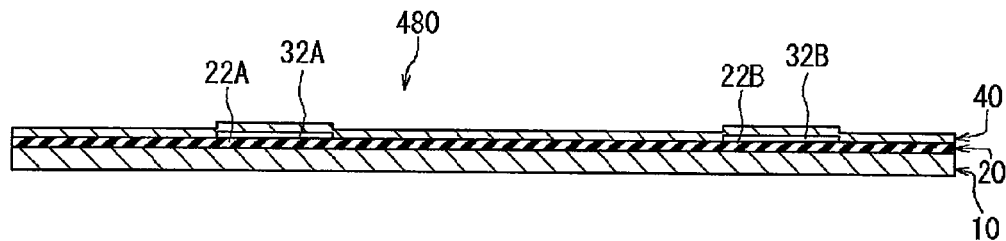
(b)
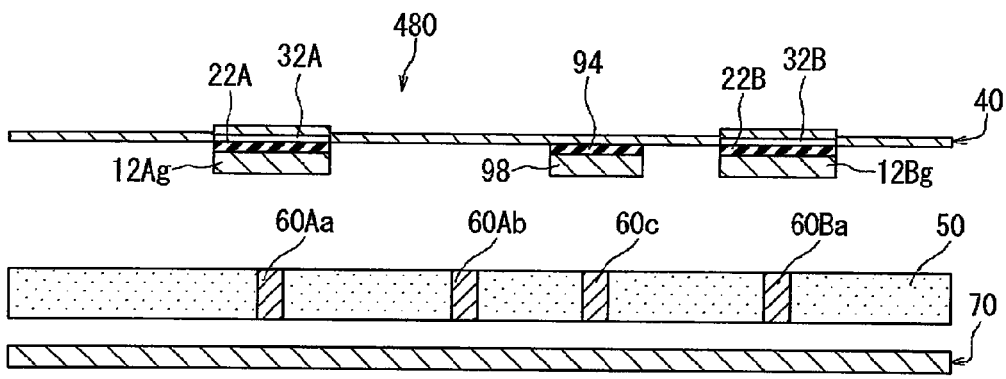
(c)
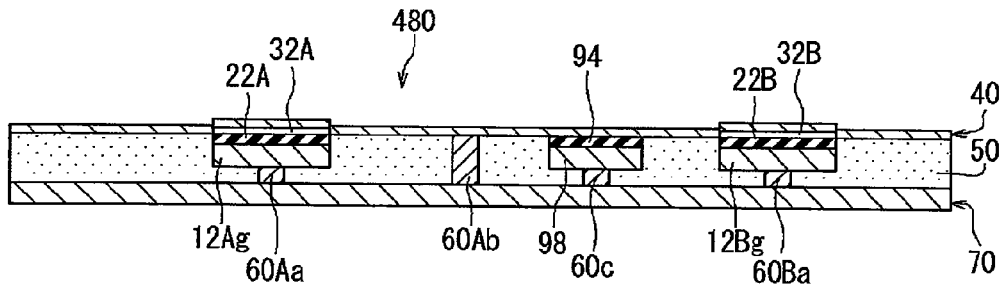
(d)
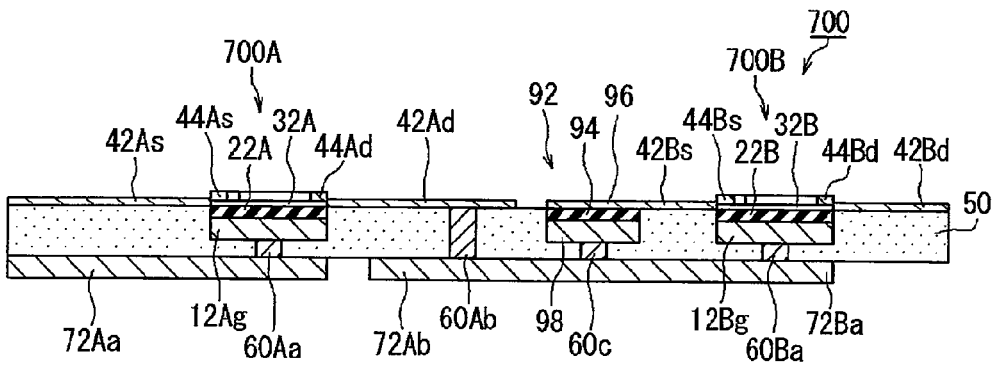

METHOD FOR MAKING A SEMICONDUCTOR DEVICE ON A FLEXIBLE SUBSTRATE

RELATED APPLICATIONS

This application is the U.S. National Phase under 35 U.S.C. §371 of International Application No. PCT/JP2009/003440, filed on Jul. 22, 2009, which in turn claims the benefit of Japanese Application No. 2008-239121, filed on Sep. 18, 2008, the disclosures of which Applications are incorporated by reference herein.

TECHNICAL FIELD

The present invention relates to methods for fabricating flexible semiconductor devices and layered films used therefore.

BACKGROUND ART

With popularization of information terminals, there has been a growing demand for flat panel displays as computer displays. Moreover, with progress in information technology, information conventionally provided on a paper medium has been increasingly provided as electronic data. Electronic paper or digital paper has therefore been increasingly demanded as a thin, lightweight, easily portable mobile display medium (for example, PATENT DOCUMENT 1).

Generally, in flat panel displays, display media are formed by using elements utilizing liquid crystal, organic EL (organic electroluminescence), electrophoresis, etc. In such display media, a technique using active driving elements (thin film transistor (TFT) elements) as image driving elements has been widely used in order to assure uniformity of screen brightness, a screen rewriting speed, and the like. For example, in a typical computer display, TFT elements are formed on a substrate, and liquid crystal, organic EL elements, or the like are sealed.

In this case, semiconductors such as amorphous silicon (a-Si) and polysilicon (p-Si) can be mainly used for the TFT elements. The TFT elements are fabricated by forming multiple layers of the Si semiconductors (and a metal film if necessary), and sequentially forming source, drain and gate electrodes on the substrate.

Moreover, formation of such TFT elements using a Si material involves a high-temperature process, adding a limitation on a substrate material that the substrate material needs to be resistant to the process temperature. Accordingly, a substrate made of a material having high heat-resistance, for example, a glass substrate needs to be used for practical applications. Note that a quartz substrate may be used, but the quartz substrate is expensive, which is economically problematic to increase the size of displays. Thus, as a substrate on which TFT elements are formed, a glass substrate is generally used.

However, a thin display formed by using the glass substrate is heavy, has poor flexibility, and may be broken if dropped. These characteristics are not desirable to satisfy the needs of portable thin displays which have risen with progress in information technology.

To satisfy the needs of light, thin displays, from the viewpoint of, for example, forming a flexible, light substrate, a semiconductor device (flexible semiconductor device) having TFT elements formed on a resin substrate (plastic substrate) has been developed.

For example, PATENT DOCUMENT 2 describes the technique of manufacturing a TFT element on a base material (e.g., a glass substrate) by substantially the same process as that conventionally used, and then peeling the TFT element from the glass substrate to transfer the TFT element on a resin substrate.

Moreover, PATENT DOCUMENT 3 describes the technique of directly forming a TFT element on a resin substrate.

CITATION LIST

Patent Document

PATENT DOCUMENT 1: Japanese Patent Publication No. 2007-67263
PATENT DOCUMENT 2: Japanese Patent Publication No. 2005-294300
PATENT DOCUMENT 3: Japanese Patent Publication No. 2006-186294

SUMMARY OF THE INVENTION

Technical Problem

However, in fabricating a TFT element by a transfer method, peeling a base material (e.g., a glass substrate) poses a problem. That is, in peeling the TFT element from the glass substrate, it is necessary, for example, to perform the process of reducing adhesion between the glass substrate and the TFT element, or to perform the process of forming a release layer between the glass substrate and the TFT element, and physically or chemically removing the release layer. Consequently, the processes are complicated, and there are still problems to be solved in terms of productivity.

Moreover, in the method of directly forming a TFT element on a resin substrate, the heat resistance of the resin substrate is low, and thus it is necessary to keep a process temperature low. Therefore, the TFT element directly formed on the resin substrate is inferior in performance to the TFT element formed on the glass substrate. Moreover, in terms of the entire circuit, wiring formed by these processes is thin, and is made of a composite material in many cases, so that the wiring has high resistance. Consequently, voltage drop in the circuit occurs, so that it is difficult to achieve desired TFT performance, device properties, and reliability.

The inventors of the present application attempted to seek solutions to the above-discussed problems of the flexible semiconductor device from a new perspective rather than seeking solutions from a conventional perspective. The present invention is made in view of the above-discussed problems, and it is an object of the present invention to provide a method for fabricating a high-performance, flexible semiconductor device having excellent productivity.

Solution to the Problem

To solve the above-mentioned problems, a method for fabricating a flexible semiconductor device of the present invention uses a method for forming a thin film transistor in which a previously prepared layered film including a first metal layer, an inorganic insulating layer, a semiconductor layer, and a second metal layer which are sequentially formed is used as a base structure, the first metal layer and the second metal layer are processed to form a gate electrode and source and drain electrodes, the inorganic insulating layer functions as a gate insulating film, and the semiconductor layer functions as a channel. With this method, it is possible to easily form a flexible semiconductor device including a thin film transistor using an inorganic insulating layer as a base material without using a high-temperature process.

That is, a method for fabricating a flexible semiconductor device according to an aspect of the present invention includes: (a) preparing a layered film including a first metal layer, an inorganic insulating layer, a semiconductor layer, and a second metal layer which are sequentially formed; (b) partially etching the first metal layer to form a gate electrode made of the first metal layer; and (c) partially etching the second metal layer to form a source electrode and a drain electrode made of the second metal layer, wherein the inorganic insulating layer on the gate electrode functions as a gate insulating film, and the semiconductor layer between the source electrode and the drain electrode on the inorganic insulating layer functions as a channel.

According to another aspect of the present invention, the method further includes: after step (b) and before step (c), (d) compression bonding a resin layer to a surface of the layered film provided with the gate electrode to allow the gate electrode to be embedded in the resin layer. With this method, instead of the inorganic insulating layer, the resin layer larger in thickness than the inorganic insulating layer can be used as a base material, so that it is possible to easily form a large area flexible semiconductor device including a thin film transistor with reduced leakage.

According to another aspect of the present invention, step (d) includes: preparing the resin layer in which conductive interlayer connectors extending from one surface to the other surface of the resin layer are formed; and compression bonding the layered film including the gate electrode to the resin layer to connect the interlayer connectors in the resin layer to the gate electrode. With this method, potential of the gate electrode embedded in the resin layer can be easily taken via the interlayer connectors at a surface of the resin layer.

According to another aspect of the present invention, the method further includes, after step (d), compression bonding a third metal layer on a surface of the resin layer, and then etching the third metal layer to form a wiring layer, wherein the wiring layer is connected via the interlayer connectors to the second metal layer. With this method, the second metal layer (e.g., the source electrode and the drain electrode) can be easily connected to the wiring layer at the surface of the resin layer.

According to another aspect of the present invention, in step (b), the first metal layer is partially etched to form a lower electrode of a capacitor simultaneously with forming the gate electrode, where the lower electrode is made of the first metal layer; in step (c), the second metal layer is partially etched to form an upper electrode of the capacitor simultaneously with forming the source electrode and the drain electrode, where the upper electrode is made of the second metal layer; and the inorganic insulating layer between the upper electrode and the lower electrode functions as a dielectric layer of the capacitor. With this method, a flexible semiconductor device including a thin film transistor and a capacitor can be formed easily.

Advantages of the Invention

According to the present invention, the layered film including the first metal layer, the inorganic insulating layer, the semiconductor layer, and the second metal layer which are sequentially formed is used as a base structure, the first metal layer and the second metal layer are processed to form the gate electrode and the source and the drain electrodes, the inorganic insulating layer functions as a gate insulating film, and the semiconductor layer functions as a channel. With this method, a flexible semiconductor device including a high-performance, thin film transistor can be formed easily.

BRIEF DESCRIPTION OF THE DRAWINGS

FIG. 3(a)-3(c) are cross-sectional views illustrating processes in the method for fabricating the flexible semiconductor device according to Embodiment 1 of the present invention in which a resin layer is used as a base material.

FIG. 4(a) is a cross-sectional view illustrating the flexible semiconductor device according to Embodiment 1 of the present invention. FIG. 4(b) is a top view illustrating the flexible semiconductor device of FIG. 4(a).

FIGS. 6(a)-6(d) are perspective views illustrating processes for fabricating a layered film for the flexible semiconductor device according to Embodiment 1 of the present invention.

FIGS. 12(a) and 12(b) are perspective views illustrating processes for fabricating a layered film for a flexible semiconductor device according to Embodiment 4 of the present invention.

FIG. 19(*a*) is a cross-sectional view illustrating a flexible semiconductor device according to Embodiment 7 of the present invention. FIG. 19(*b*) is a top view illustrating the flexible semiconductor device of FIG. 19(*a*). FIG. 19(*c*) is a diagram illustrating an equivalent circuit of the flexible semiconductor device of FIG. 19(*a*).

FIGS. 20(*a*)-(*d*) are cross-sectional views illustrating processes for fabricating the flexible semiconductor device according to Embodiment 7 of the present invention.

DESCRIPTION OF EMBODIMENTS

The assignee of the present application made studies on methods for fabricating flexible semiconductor devices available for thin displays, and proposed a method for fabricating a flexible semiconductor device having excellent productivity in the specification of PCT International Application PCT/JP2008/002759.

Figure 1:
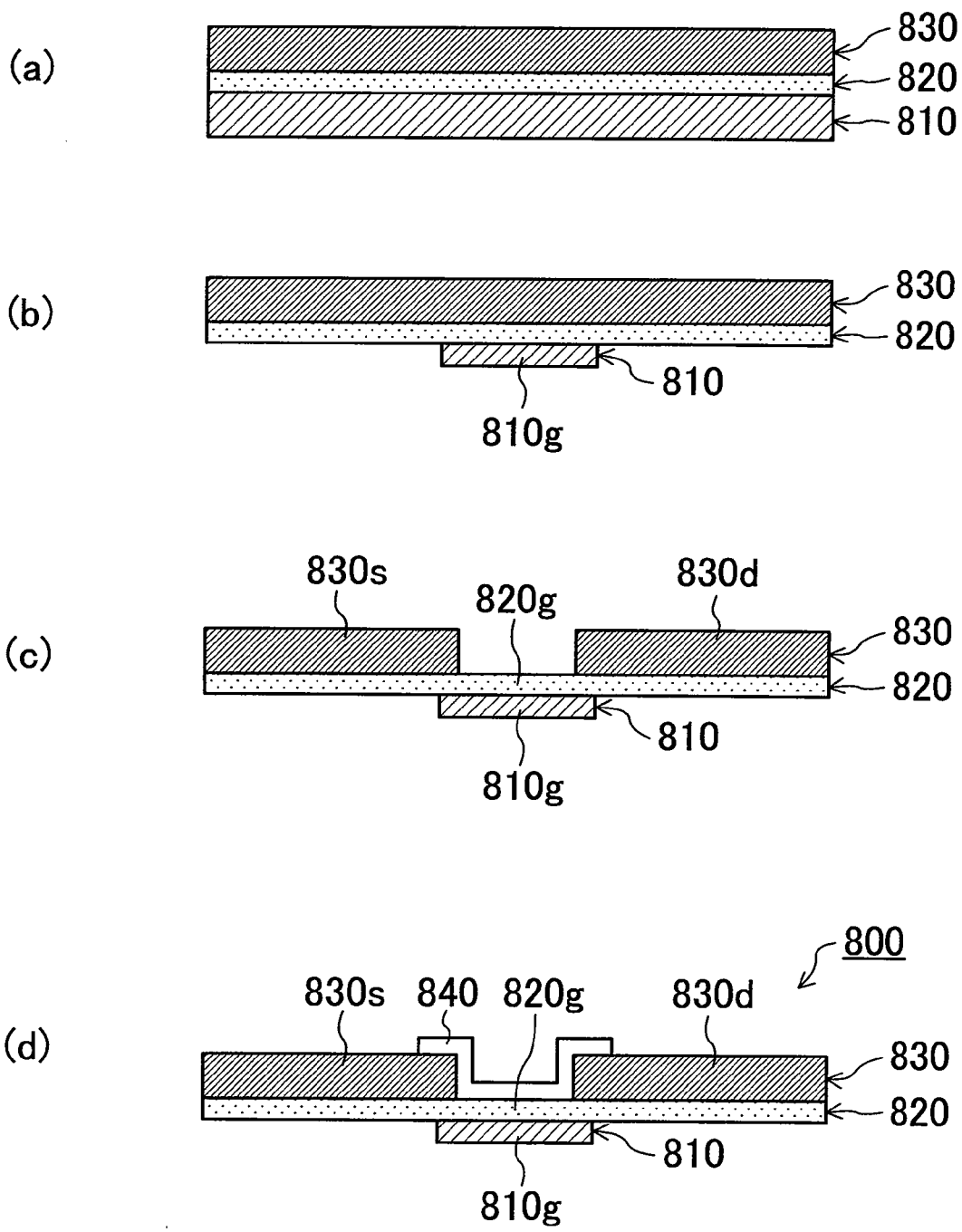
FIGS. 1(a)-1(d) are cross-sectional views illustrating basic processes in a method for fabricating a flexible semiconductor device disclosed in the specification of PCT International Application PCT/JP2008/002759.

FIGS. 1(*a*)-1(*d*) are cross-sectional views illustrating basic processes in a method for fabricating a flexible semiconductor device 800 disclosed in the specification of the above-mentioned application.

First, as illustrated in FIG. 1(*a*), a layered film of a three-layer clad foil is prepared. The three-layer clad foil includes an inorganic insulating layer 820, and a first metal layer 810 and a second metal layer 830 respectively formed on both surfaces of the inorganic insulating layer 820. After that, as illustrated in FIG. 1(*b*), the first metal layer 810 is partially etched to form a gate electrode 810*g* of a thin film transistor.

Next, as illustrated in FIG. 1(*c*), the second metal layer 830 is partially etched to form a source electrode 830*s* and a drain electrode 830*d* in a region corresponding to the gate electrode 810*g*. Here, the gate electrode 810*g* may be formed after the source electrode 830*s* and the drain electrode 830*d* are formed. In any case, the gate electrode 810*g*, the source electrode 830*s*, and the drain electrode 830*d* can be formed because the inorganic insulating layer 820 functions as a base material.

Next, as illustrated in FIG. 1(*d*), a semiconductor layer 840 is formed in contact with the source electrode 830*s* and the drain electrode 830*d*, where the semiconductor layer 840 is on the gate electrode 810*g* with the inorganic insulating layer 820 interposed therebetween. Here, the inorganic insulating layer 820 on the gate electrode 810*g* functions as a gate insulating film 820*g*, and the semiconductor layer 840 between the source electrode 830*s* and the drain electrode 830*d* on the inorganic insulating layer 820 functions as a channel. The flexible semiconductor device including a thin film transistor is thus completed.

As described above, the layered film of the three-layer clad foil is prepared, where the three-layer clad foil includes the inorganic insulating layer 820, and the first metal layer 810 and the second metal layer 830 respectively formed on both of the surfaces of the inorganic insulating layer 820. Using the layered film as a base structure, the first metal layer 810 and the second metal layer 830 are processed to form the gate electrode 810*g*, the source electrode 830*s*, and the drain electrode 830*d*. After that, the semiconductor layer 840 is formed on the gate electrode 810*g* with the inorganic insulating layer (gate insulating film) 820 interposed therebetween by using a low-temperature process (e.g., a printing method). Thus, the thin film transistor can be easily formed without using a high-temperature process. Moreover, of the three-layer clad foil, the inorganic insulating layer 820 interposed between the first metal layer 810 and the second metal layer 830 functions as a base material. A flexible semiconductor device including a plurality of thin film transistors can therefore be easily formed.

The inventors of the present application further studied on the above method for fabricating the flexible semiconductor device. As a result, the inventors arrived at a method for fabricating a higher-performance, flexible semiconductor device having excellent productivity.

Embodiments of the present invention will be described in detail below with reference to the drawings. Note that for simplicity of description, the same reference symbols are used to represent elements having substantially the same functions in the figures below. Moreover, in terms of dimensions (length, width, thickness, etc.), the drawings are not to scale. The present invention is not limited to the following embodiments. Further, modifications can be made accordingly without departing the effective scope of the present invention. Furthermore, one or more embodiments can be combined with one or more other embodiments.

Embodiment 1

Figure 2:
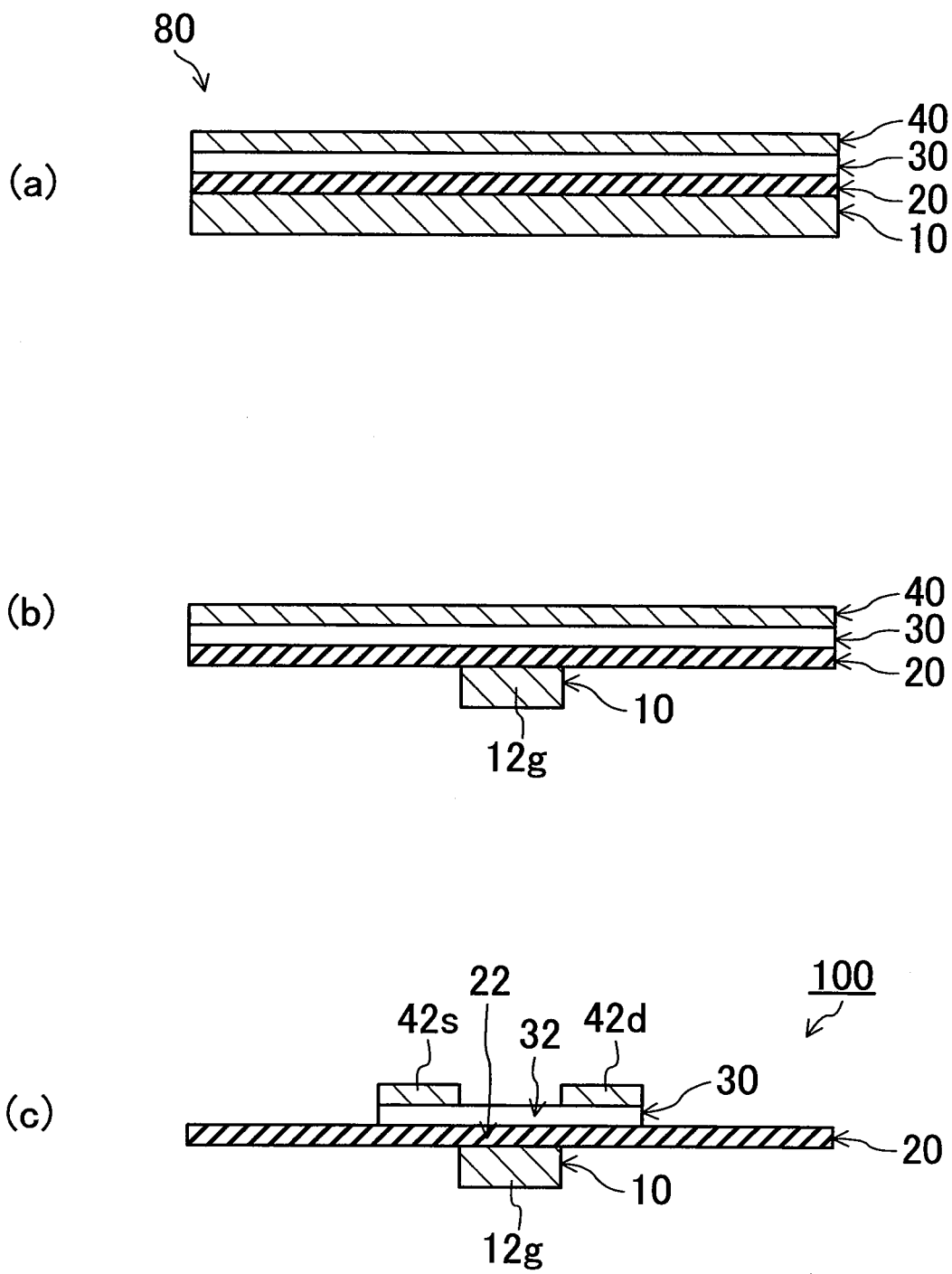
FIGS. 2(a)-2(c) are cross-sectional views illustrating basic processes in a method for fabricating a flexible semiconductor device according to Embodiment 1 of the present invention.

FIGS. 2(*a*)-2(*c*) are cross-sectional views illustrating basic processes in a method for fabricating a flexible semiconductor device 100 according to Embodiment 1 of the present invention.

First, as illustrated in FIG. 2(*a*), a layered film 80 is prepared, where the layered film 80 includes a first metal layer 10, an inorganic insulating layer 20, a semiconductor layer 30, and a second metal layer 40 which are sequentially formed. Here, the first metal layer 10 and the second metal layer 40 may be made of either the same material or different materials. Although the inorganic insulating layer 20 may be made of any material, the inorganic insulating layer is desirably a thin film having a high relative dielectric constant because the inorganic insulating layer functions as a gate insulating film of a thin film transistor. Moreover, the semiconductor layer 30 may be made of any material, but the semiconductor layer 30 is desirably a thin film having a high carrier mobility because the semiconductor layer 30 functions as a channel of the thin film transistor. Further, either an inorganic semiconductor material or an organic semiconductor material may be used for the semiconductor layer 30. Note that the layered film 80 can be formed by various methods described below.

Next, as illustrated in FIG. 2(*b*), the first metal layer 10 is partially etched to form a gate electrode 12*g* from the first metal layer 10.

Next, as illustrated in FIG. 2(*c*), the second metal layer 40 is partially etched to form a source electrode 42*s* and a drain electrode 42*d* from the second metal layer 40. After that, the semiconductor layer 30 is removed by etching such that the semiconductor layer 30 is left in a thin film transistor formation region (in at least a region including the channel).

Here, the inorganic insulating layer 20 on the gate electrode 12*g* functions as a gate insulating film 22, and the semiconductor layer 30 on the inorganic insulating layer 20 between the source electrode 42*s* and the drain electrode 42*d* functions as a channel 32. The flexible semiconductor device 100 is thus completed.

Here, etchants for the first metal layer 10 and the second metal layer 40 can be selected according to the respective materials of the first metal layer 10 and the second metal layer 40, and either a wet etching method or a dry etching method may be used. The gate electrode 12*g* may be formed after the source electrode 42*s* and the drain electrode 42*d* are formed.

As described above, the layered film 80 including the first metal layer 10, the inorganic insulating layer 20, the semiconductor layer 30, and the second metal layer 40 is prepared in advance, and only etching the first metal layer 10, the second metal layer 40, and the semiconductor layer 30 using the layered film 80 as a base structure (low-temperature process) is necessary to be able to form a thin film transistor including the gate electrode 12g, the source electrode 42s, the drain electrode 42d, and the channel 32. Thus, the flexible semiconductor device can be easily formed without using a high-temperature process.

In the present invention, the inorganic insulating layer 20 cannot be so thick because it functions as the gate insulating film 22. For this reason, the strength of the inorganic insulating layer 20 as a base material may not be ensured in the case where a large area flexible semiconductor device having a multiplicity of thin film transistors is formed. Moreover, in the case where a plurality of thin film transistors is formed, the gate insulating film 22 in each thin film transistor cannot be separated from each other because the inorganic insulating layer 20 is used as a base material. Accordingly, when thin film transistors are formed close to each other, leakage may occur between adjacent thin film transistors.

In such a case, after the process illustrated in FIG. 2(b), the inorganic insulating layer 20 is further etched such that the inorganic insulating layer 20 is left in the thin film transistor formation region (in at least a region including the gate insulating film) as illustrated in FIG. 3(a).

After that, as illustrated in FIG. 3(b), to a surface of the layered film provided with the gate electrode 12g, a resin layer 50 is compression bonded to allow the gate electrode 12g to be embedded in the resin layer 50. At this time, the inorganic insulating layer 20 left in the thin film transistor formation region is also embedded in the resin layer 50.

After that, as illustrated in FIG. 3(c), the second metal layer 40 is partially etched to form a source electrode 42s and a drain electrode 42d from the second metal layer 40. After that, the semiconductor layer 30 is removed by etching such that the semiconductor layer 30 is left in the thin film transistor formation region is formed (in at least a region including the channel 32).

In this case, instead of the inorganic insulating layer 20, the resin layer 50 having a larger thickness than that of the inorganic insulating layer 20 can be used as a base material. Thus, a large area flexible semiconductor device including thin film transistors with reduced leakage can be easily formed.

Here, the resin layer 50 may be made of any material, but the resin layer 50 is preferably made of a material which is plastic enough to allow the gate electrode 12g to be embedded therein, and at least a surface of which has an excellent adhesion property to the first metal layer 10 and the semiconductor layer 30.

With reference to FIGS. 4(a) and 4(b), and FIGS. 5(a)-5(d), a specific configuration of the flexible semiconductor device 100 according to Embodiment 1 of the present invention and a method for fabricating the same will be described below more specifically. FIG. 4(b) is a top view schematically illustrating the flexible semiconductor device 100. FIG. 4(a) is a cross-sectional view schematically illustrating the flexible semiconductor device 100 along the A-A of FIG. 4(b).

The flexible semiconductor device 100 includes the resin layer 50, the gate electrode 12g, the gate insulating film 22, the semiconductor layer 32 which are formed in the resin layer 50, the source electrode 42s, and the drain electrode 42d (hereinafter the gate electrode 12g, the gate insulating film 22, the semiconductor layer 32, the source electrode 42s, and the drain electrode 42d are collectively also referred to as a "TFT structure").

The resin layer 50 is a base material supporting the TFT structure, and is preferably made of a resin material which can be thinly bent after curing. Representative examples of such a resin material include, for example, an epoxy resin, a polyimide (PI) resin, an acrylic resin, a polyethylene terephthalate (PET) resin, a polyethylene naphthalate (PEN) resin, a polyphenylene sulfide (PPS) resin, a polyphenylene ether (PPE) resin, a composite of the above resins, and the like. These resin materials are excellent in dimensional stability, and thus are preferable as a material for a flexible base material in the flexible semiconductor device 100 of the present embodiment.

In the resin layer 50, the gate electrode 12g is embedded. As a metal constituting the gate electrode 12g, a metal material having high conductivity is preferable, and for example, copper (Cu), nickel (Ni), aluminum (Al), or stainless (SUS) can be used.

On the gate electrode 12g, the gate insulating film 22 is provided. As a material for forming the gate insulating film 22, an inorganic compound having a relatively high relative dielectric constant is preferable, and the relative dielectric constant is desirably 8 or higher, and more preferably 25 or higher. Representative examples of the inorganic compound having such a relative dielectric constant include, for example, a metal oxide such as a tantalum oxide (e.g., $Ta_2O_5$), an aluminum oxide (e.g., $Al_2O_3$), a silicon oxide (e.g., $SiO_2$), a zeolite oxide (e.g., $ZrO_2$), a titanium oxide (e.g., $TiO_2$), an yttrium oxide (e.g., $Y_2O_3$), a lanthanum oxide (e.g., $La_2O_3$), and a hafnium oxide (e.g., $HfO_2$), and nitrides of the above metals. Alternatively, a dielectric material such as a barium titanate ($BaTiO_3$), a strontium titanate ($SrTiO_3$), or a calcium titanate ($CaTiO_3$) may be used for the gate insulating film 22.

On the gate insulating film 22, the semiconductor layer 32 is provided. In the illustrated embodiment, the semiconductor layer 32 faces the gate electrode 12g with the gate insulating film 22 interposed therebetween. The semiconductor layer 32 may be made of various materials. For example, a semiconductor such as silicon (e.g., Si) or germanium (Ge), or an oxide semiconductor may be used. Examples of the oxide semiconductor include: an elementary oxide such as a zinc oxide (ZnO), a tin oxide ($SnO_2$), an indium oxide ($In_2O_3$), a titanium oxide ($TiO_2$), etc.; and a composite oxide such as InGaZnO, InSnO, InZnO, ZnMgO, etc. Alternatively, a compound semiconductor (e.g., GaN, SiC, ZnSe, CdS, GaAs, or the like) or an organic semiconductor (e.g., pentacene, poly (3-exylthiophene), porphyrin derivative, copper phthalocyanine, C60, or the like) can be used as necessary.

On the resin layer 50, the source electrode 42s and the drain electrode 42d are provided. As a metal for forming the source electrode 42s and the drain electrode 42d, a metal material having high conductivity is preferable, and for example, copper (Cu), nickel (Ni), aluminum (Al), or stainless (SUS) can be used.

In Embodiment 1, an interlayer connector 60a connected to the gate electrode 12g is provided in the resin layer 50. Moreover, a wiring layer 72a is provided on a surface (e.g., a lower surface in the figure) of the resin layer 50 opposite to its surface provided with the source electrode 42s and the drain electrode 42d. Via the interlayer connector 60a in the resin layer 50, the gate electrode 12g is electrically connected to the wiring layer 72a. In this embodiment, the resin layer 50 also includes an interlayer connector 60b connecting the drain electrode 42d to a wiring layer 72b.

In Embodiment 1, the interlayer connector 60a is a so-called paste via, and is made of a conductive paste filling an opening extending from an upper surface to a lower surface of the resin layer 50. As the conductive paste, general conductive paste materials can be used. Representative examples of the general conductive paste materials include, for example, a mixture of Ag-plated copper powder and a resin composition containing an epoxy resin as a main component. Moreover, as a metal for forming the wiring layer 72a, a metal material having high conductivity is preferable, and for example, copper (Cu), nickel (Ni), aluminum (Al), or stainless (SUS) can be used.

Figure 5:
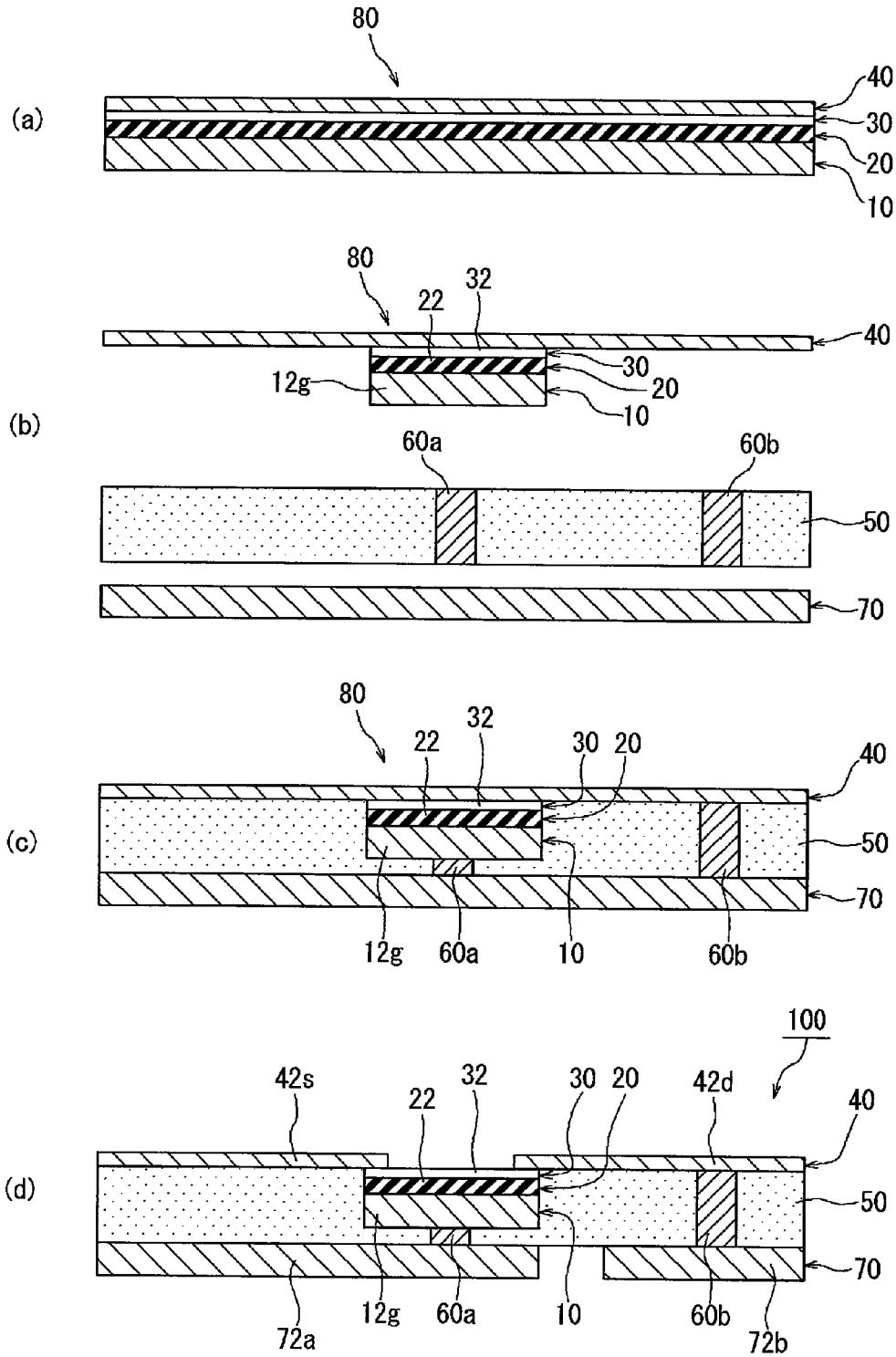
FIGS. 5(a)-5(d) are cross-sectional views illustrating processes for fabricating the flexible semiconductor device according to Embodiment 1 of the present invention.

Next, with reference to FIGS. 5(*a*)-5(*d*), the method for fabricating the flexible semiconductor device 100 of the present embodiment will be described. FIGS. 5(*a*)-5(*d*) are cross-sectional views illustrating processes for fabricating the flexible semiconductor device 100. The flexible semiconductor device 100 is fabricated by using a layered film 80 including a first metal layer 10, an inorganic insulating layer 20, a semiconductor layer 30, and a second metal layer 40 which are sequentially formed. This will be described below.

First, as illustrated in FIG. 5(*a*), the layered film 80 is prepared (for example, manufactured, or purchased). The layered film 80 includes the first metal layer 10, the inorganic insulating layer 20 formed on an upper surface of the first metal layer 10, the semiconductor layer 30 formed on an upper surface of the inorganic insulating layer 20, and the second metal layer 40 formed on an upper surface of the semiconductor layer 30. In Embodiment 1, the first metal layer 10 is a copper foil having a thickness of 12 µm, the inorganic insulating layer 20 is barium titanate having a thickness of 0.8 µm, the semiconductor layer 30 is a polysilicon film having a thickness of 0.3 µm, and the second metal layer 40 is a copper foil having a thickness of 1 µm.

Next, as illustrated in FIG. 5(*b*), the first metal layer 10 of the layered film 80 is etched to form a gate electrode 12g from the first metal layer 10. As an etchant, a suitable etchant may be used according to a material, and the like of the first metal layer 10. In the case where the first metal layer 10 is, for example, a copper foil, ferric chloride can be used.

Moreover, in Embodiment 1, in addition to etching the first metal layer 10, the inorganic insulating layer 20 is partially removed to form a gate insulating film 22 on the gate electrode 12g. As a method for removing the inorganic insulating layer 20, for example, laser irradiation, etching, or the like can be used. As an etchant, a suitable etchant may be used according to a material of the inorganic insulating layer 20. In the case where the inorganic insulating layer 20 is, for example, a titanium composite oxide, a hydrofluoric acid-nitric acid mixture can be used.

Furthermore, in Embodiment 1, the semiconductor layer 30 is also patterned. The semiconductor layer 30 can be patterned by, for example, laser irradiation, etching, or the like. As an etchant, a suitable etchant may be used according to a material of the semiconductor layer 30. In the case where the semiconductor layer 30 is, for example, a polysilicon film, a hydrofluoric acid-nitric acid mixture can be used.

Next, as illustrated in FIG. 5(*c*), a resin layer 50 is formed to cover a surface of the layered film 80 provided with the gate electrode 12g. In Embodiment 1, the layered film 80 provided with the gate electrode 12g is compression bonded (bonded by applying pressure) to a resin sheet 50, thereby forming the resin layer 50. The compression bonding allows the layered film 80 and the resin sheet 50 to be integrally laminated, embedding the gate electrode 12g in the resin sheet 50. Moreover, in Embodiment 1, the resin sheet 50 has a paste via 60a formed therein in advance. The layered film 80 provided with the gate electrode 12g is compression bonded to the resin sheet 50 having the paste via 60a to connect the paste via 60a in the resin sheet 50 to the gate electrode 12g.

As a method of the compression bonding, for example, a roll laminating method, a vacuum laminating method, a method of applying pressure with the application of heat by, for example, hot-pressing, or the like may be used. As the resin sheet 50, for example, a resin film on a surface of which an adhesive material (e.g., an epoxy resin, an acrylic resin, a polyimide resin, or the like) is applied, or an uncured resin film can be used. Here, as the resin sheet 50, a polyimide resin film having a thickness of 12.5 µm on a surface of which an adhesive epoxy resin is applied is prepared, and is bonded to a lower surface of the second metal layer 40 so that the polyimide resin film and the second metal layer 40 are integrated.

Moreover, on a surface (a lower surface in the figure) of the resin sheet 50 opposite to its surface on which the layered film 80 is compression bonded, a third metal layer 70 is compression bonded to be connected to the interlayer connectors 60a and 60b in the resin sheet 50. The compression bonding allows the third metal layer 70 and resin sheet 50 to be integrally laminated. Here, as the third metal layer 70, a copper foil having a thickness of 9 µm is prepared, and bonded to the lower surface of the resin sheet 50 so that the copper foil and the resin sheet 50 are integrated. The compression bonding of the third metal layer 70 and the compression bonding of the layered film 80 may be performed either in the same process or in different processes as necessary.

After the layered film 80, the resin sheet 50, and the third metal layer 70 are integrally laminated, the second metal layer 40 of the layered film 80 is etched as illustrated in FIG. 5(*d*) to form a source electrode 42s and a drain electrode 42d from the second metal layer 40. As an etchant, a suitable etchant may be used according to a material of the second metal layer 40. In the case where the second metal layer 40 is, for example, a copper foil, ferric chloride can be used.

Moreover, the third metal layer 70 is partially etched to form wiring layers 72a and 72b from the third metal layer 70. As an etchant, a suitable etchant may be used according to a material of the third metal layer 70, and in the case where the third metal layer 70 is, for example, a copper foil, ferric chloride can be used. The third metal layer 70 and the second metal layer 40 may be etched either in the same process or in different processes as necessary.

In this way, he flexible semiconductor device 100 according to Embodiment 1 can be formed. According to the fabrication method of Embodiment 1, the layered film 80 including the first metal layer 10, the inorganic insulating layer 20, the semiconductor layer 30, and the second metal layer 40 is used, so that a TFT structure can be easily formed. Moreover, a high-performance, flexible semiconductor device 100 can be fabricated with excellent productivity. More specifically, a high-temperature process for manufacturing the layered film 80 is separately performed from the processes for forming the TFT structure, so that it is possible to improve total productivity.

Specifically, manufacturing the layered film 80 by a later-described high-temperature process (for example, a process temperature above a heat resistance temperature limit of the resin sheet 50) is separated from forming a TFT structure on the resin sheet 50 by using the layered film 80. Thus, it is not necessary to introduce the high-temperature process into the fabrication process using the resin sheet 50. Therefore, the fabrication process using the resin sheet 50 can be performed simply and easily with the TFT characteristics being improved by supporting the high-temperature process. As a result, it is possible to provide a high-performance, flexible semiconductor device 100 with excellent productivity.

The layered film 80 according to the present embodiment is manufactured by, for example, processes illustrated in FIGS. 6(a)-6(d).

First, as illustrated in FIG. 6(a), a first metal layer 10 is prepared. The first metal layer 10 is, for example, a foil metal. The first metal layer 10 may not be limited to a single metal foil, but may be a carrier film (e.g., a resin film such as PET) on which a metal film is deposited by a thin film formation method such as sputtering. Here, as the first metal layer 10, a copper foil is prepared.

Next, as illustrated in FIG. 6(b), an inorganic insulating layer 20 is formed on the first metal layer 10. The inorganic insulating layer 20 can be formed by a high-temperature process involving a step performed at or above a process temperature above a heat resistance temperature limit of the resin sheet 50. Examples of a method for forming the inorganic insulating layer 20 include a sol-gel method, a chemical synthesis method, and the like.

In Embodiment 1, a dispersed solution in which nano particles of barium titanate ($BaTiO_3$) are dispersed is applied to the first metal layer 10 and dried, pre-baked in a nitrogen atmosphere, and then baked (for example, at a baking temperature of 600° C.-800° C.). In this way, the inorganic insulating layer 20 made of barium titanate is formed. A method for applying the dispersed solution is not limited to a particular one, but for example, a spin coating method, a roll coating method, a curtain coating method, a splaying method, a liquid dropping method, or the like can be used. The inorganic insulating layer 20 (gate insulating film 22) manufactured by such a baking process (high-temperature process) has a higher relative dielectric constant than that of the polymeric film, and thus is particularly preferable as a material for the inorganic insulating layer 20 of the flexible semiconductor device 100.

Alternatively, as a method for forming the inorganic insulating layer 20, a general thin film formation method can be used. Representative examples of the thin film formation method include a vacuum deposition method, a laser abrasion method, a sputtering method, a CVD method (e.g., a plasma CVD method), and the like. The laser ablation method is capable of forming a film with a small change in composition of an inorganic compound. The CVD method is preferable in that deposition of an inorganic insulating layer is easy, synthesis of a multi-component film is possible, and a high dielectric constant film can be formed.

Note that the inorganic insulating layer 20 can be a metal oxide film made of a metal forming the first metal layer 10. In this case, the inorganic insulating layer 20 can be formed by oxidizing an upper surface of the first metal layer 10. The oxidation process of the first metal layer 10 is performed by, for example, an anodization method, a thermal oxidation method (surface oxidation process by heating), or a chemical oxidation method (surface oxidation process by an oxidizing agent). Note that in the case where the inorganic insulating layer 20 is a metal oxide film of the first metal layer 10, the first metal layer 10 may be made of any metal that can be oxidized by the above oxidizing process, and is not limited to a specific metal. However, the first metal layer 10 is preferably made of a valve metal (e.g., aluminum or tantalum). In the case of a valve metal, an anodization method can be used, an oxide coating film can be formed in a simple manner on the metal surface, and the thickness of the inorganic insulating layer 20 can be reduced (for example, to 1 μm or less, and preferably to 0.6 μm or less).

After the inorganic insulating layer 20 is formed, a semiconductor layer 30 is formed on the inorganic insulating layer 20 as illustrated in FIG. 6(c). The semiconductor layer 30 is formed by, for example, depositing a semiconductor material on an upper surface of the inorganic insulating layer 20. The semiconductor material can be deposited using, for example, a thin film formation process such as a vacuum deposition method, a sputtering method, and a plasma CVD method, or a print process such as an inkjet method.

The semiconductor layer 30 can be formed by a high-temperature process involving a step performed at or above a process temperature above a heat resistance temperature limit of the resin sheet 50. More specifically, after a semiconductor material is deposited on the inorganic insulating layer 20, the deposited semiconductor material is preferably subjected to a heat treatment. The method for heating the semiconductor material is not specifically limited, but may be, for example, a thermal annealing process (atmosphere heating), a laser annealing process, or a process using the thermal annealing process and the laser annealing process in combination. The heat treatment (high-temperature process) is thus performed to progress crystallization of a semiconductor. As a result, a semiconductor property (typically, carrier mobility) can be improved.

In Embodiment 1, a solution containing cyclopentasilane is irradiated with UV to obtain a higher-order silane compound, and then the solution containing the higher-order silane compound is applied to the upper surface of the inorganic insulating layer 20. Next, a heat treatment at a temperature of 300° C.-600° C. is performed to form the semiconductor layer 30 made of an amorphous silicon. Then, a laser annealing process is performed to form a polysilicon film having a high carrier mobility. The method for applying the solution is not limited to a particular one, but for example, a spin coating method, a roll coating method, a curtain coating method, a splaying method, a liquid dropping method, or the like may be used.

In the case of an oxide semiconductor, for example, an organic metal mixture is deposited on the inorganic insulating layer 20, and then is subjected to a heat treatment (for example 600° C. or above) to sinter the metal, thereby forming an oxide semiconductor having a high carrier mobility.

After the semiconductor layer 30 is thus formed, a second metal layer 40 is formed on the semiconductor layer 30 as illustrated in FIG. 6(d). The second metal layer 40 can be formed by, for example, depositing a metal on an upper surface of the semiconductor layer 30. As a method for depositing the second metal layer 40, for example, a vacuum deposition method or a sputtering method can be preferably used.

In this way, it is possible to obtain the layered film 80 including the first metal layer 10, the inorganic insulating layer 20, the semiconductor layer 30, and the second metal layer 40 which are sequentially formed. According to the fabrication method of the present embodiment, the layered film 80 can be manufactured at a process temperature above a heat resistance temperature limit of the resin sheet 50. Thus, it is possible to provide the layered film 80 which can improve TFT characteristics by supporting the high-temperature process, and is suitable for fabrication of the high-performance, flexible semiconductor device 100. Note that the above layers 10, 20, 30, and 40 may be formed in inverse order. It may be possible that the second metal layer 40 is first formed, the semiconductor layer 30 is formed on the second metal layer 40, the inorganic insulating layer 20 is formed on the semiconductor layer 30, and then the first metal layer 10 is formed on the inorganic insulating layer 20.

A configuration of a flexible semiconductor device according to other embodiments of the present invention and methods for fabricating the same will be described below.

Embodiment 2

Figure 7:
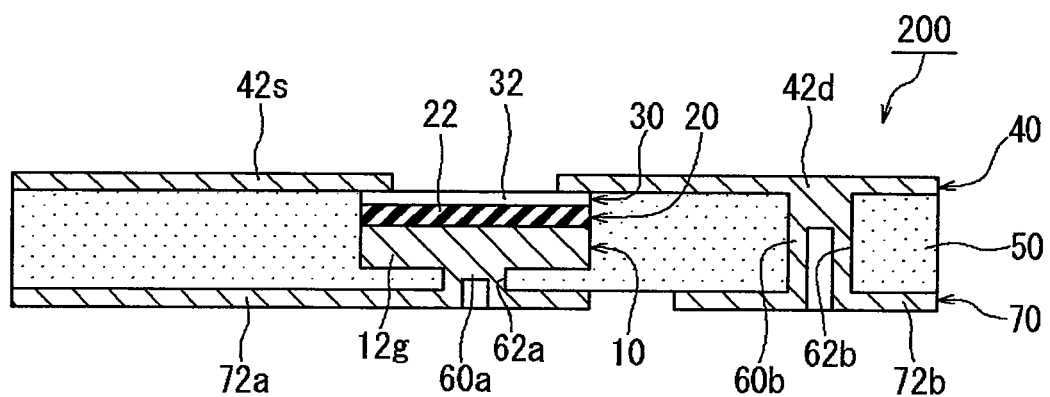
FIG. 7 is a cross-sectional view illustrating a flexible semiconductor device according to Embodiment 2 of the present invention.

FIG. 7 illustrates a configuration of a flexible semiconductor device 200 according to Embodiment 2 of the present invention. Embodiment 2 is different form Embodiment 1 in that an interlayer connector 60a connected to a gate electrode 12g is not a paste via but a plating via. The plating via 60a is formed in a resin sheet 50 after a layered film 80 and the resin sheet 50 are integrally laminated. With reference to FIGS. 8(a)-8(d), an example fabrication process of the flexible semiconductor device 200 will be described. Note that the same description as that in Embodiment 1 other than matters particularly described in Embodiment 2 will be omitted.

Figure 8:
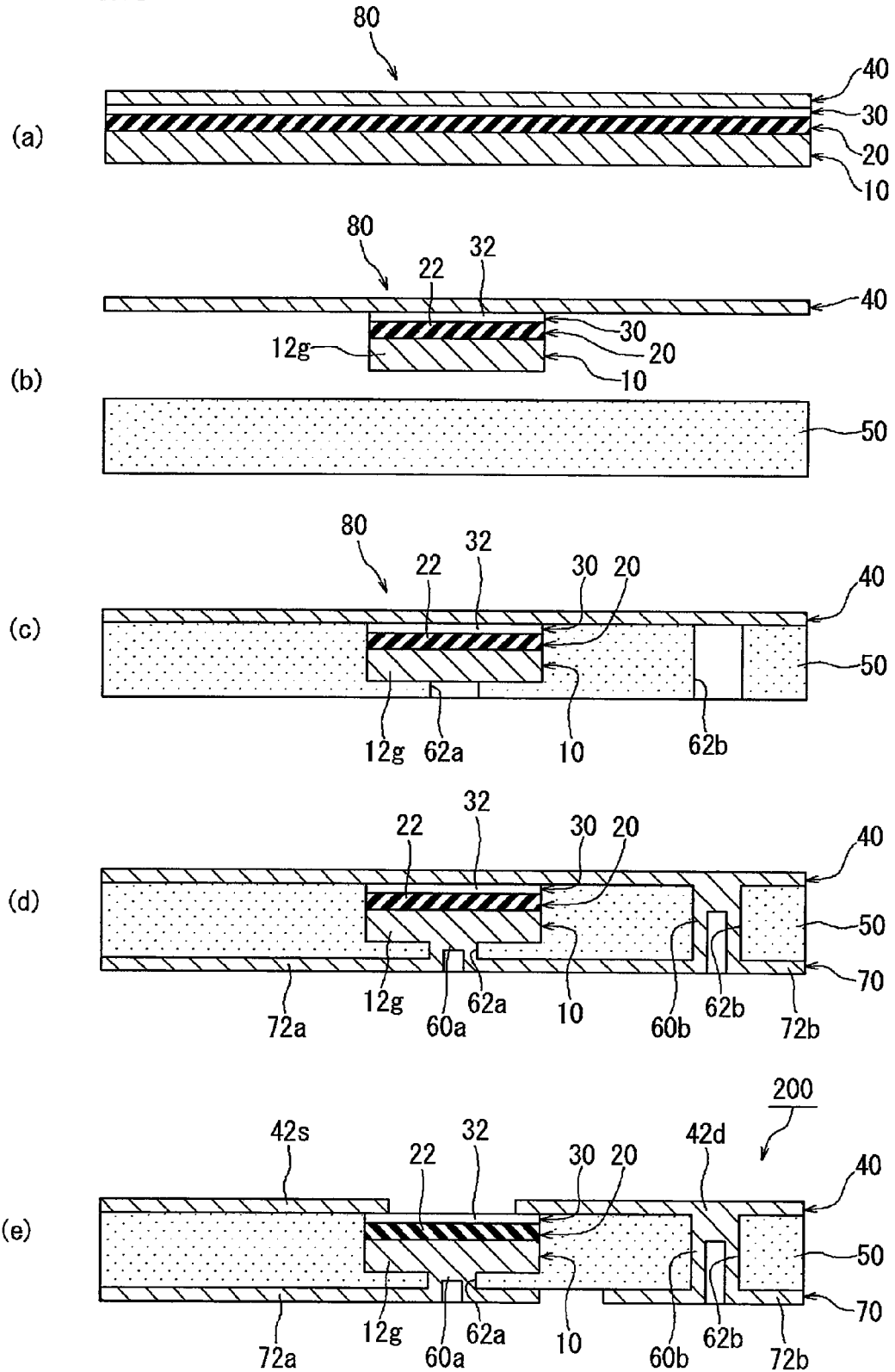
FIGS. 8(a)-8(e) are cross-sectional views illustrating processes for fabricating the flexible semiconductor device according to Embodiment 2 of the present invention.

First, as illustrated in FIG. 8(a), a layered film 80 is prepared, where the layered film 80 includes a first metal layer 10, an inorganic insulating layer 20, a semiconductor layer 30, and a second metal layer 40 which are sequentially formed.

Next, as illustrated in FIG. 8(b), the first metal layer 10 of the layered film 80 is etched to form a gate electrode 12g from the first metal layer 10. Moreover, the inorganic insulating layer 20 and the semiconductor layer 30 are partially removed to form a gate insulating film 22 and a semiconductor layer 32.

Next, as illustrated in FIG. 8(c), a resin layer 50 is formed to cover a surface of the layered film 80 provided with the gate electrode 12g. In Embodiment 2, the layered film 80 provided with the gate electrode 12g is compression bonded to a resin sheet 50 to allow the gate electrode 12g to be embedded in the resin sheet 50. Note that a method for forming the resin layer 50 is not limited to the method of compression bonding of the resin sheet 50, but the resin layer 50 may be formed by, for example, applying a resin material to the layered film 80 (by, for example, spin coating, roll coating, or the like).

After that, in a surface (lower surface in the figure) of the resin sheet 50 opposite to its surface provided with the layered film 80 by compression bonding, an opening 62a exposing part of the gate electrode 12g is formed. The opening 62a can be formed by, for example, laser irradiation. Here, in addition to the opening 62a, an opening 62b exposing part of a lower surface of the second metal layer 40 is also formed.

Next, as illustrated in FIG. 8(d), on the surface of the resin sheet 50 opposite to its surface provided with the layered film 80 by compression bonding, a plating layer 70 is formed such that the plating layer 70 is in contact with the gate electrode 12g through the opening 62a. Specifically, the plating layer 70 is deposited to cover a wall surface of the opening 62a and a lower surface of the gate electrode 12g to form a plating via 60a. Moreover, the plating layer 70 is deposited to cover a lower surface of the resin sheet 50 to form a third metal layer 70. The plating layer 70 can be formed by, for example, an electroless or electro copper plating process by an additive method. Here, on the lower surface of the resin sheet 50, an electroless copper plating layer is thinly formed, and then is subjected to an electro copper plating process to increase the thickness of the copper plating layer, thereby forming the plating layer 70 having a thickness of about 2 μm.

After that, as illustrated in FIG. 8(e), the second metal layer 40 is partially etched to form a source electrode 42s and a drain electrode 42d. Moreover, the plating layer (third metal layer) 70 is partially etched to form a wiring layer 72a connected to the gate electrode 12g through the plating via 60a. The wiring layers 72a and 72b may be formed by slice etching using a resist.

The flexible semiconductor device 200 having the plating via formed as an interlayer connector can thus be fabricated. With the method for fabricating the flexible semiconductor device 200 according to Embodiment 2, it is possible to easily connect the gate electrode 12g to the plating via 60a. That is, in the case where the interlayer connector is a paste via (Embodiment 1), when the layered film 80 is compression bonded to the resin sheet 50, high positioning accuracy is required so that the paste via 60a comes into contact with the gate electrode 12g. However, in the case where the interlayer connector is a plating via (Embodiment 2), when the layered film 80 is compression bonded to the resin sheet 50, the high positioning accuracy is no longer necessary. Thus, the flexible semiconductor device 200 can be fabricated simply and stably.

Embodiment 3

Figure 9:
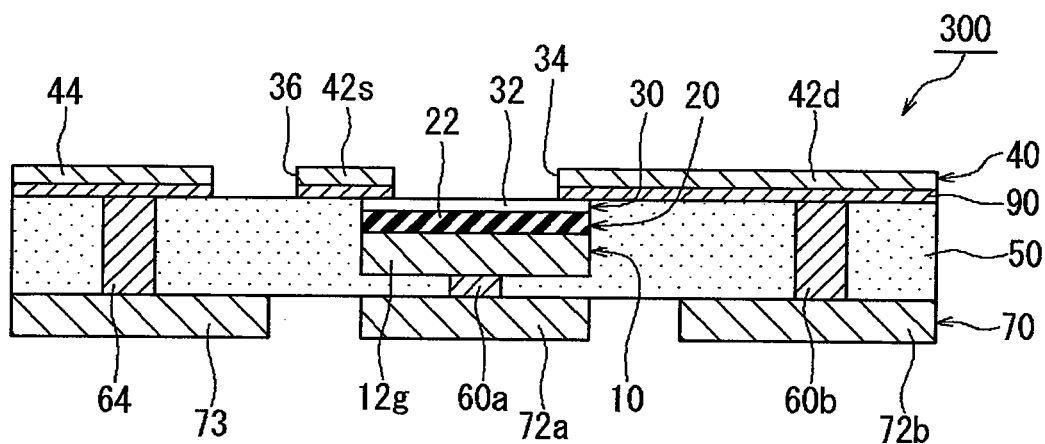
FIG. 9 is a cross-sectional view illustrating a flexible semiconductor device according to Embodiment 3 of the present invention.

FIG. 9 illustrates a configuration of a flexible semiconductor device 300 according to Embodiment 3 of the present invention. Embodiment 3 differs from Embodiment 1 in that an anti-diffusion layer (barrier layer) 90 is provided. In Embodiment 3, the anti-diffusion layer 90 is provided between a source electrode 42s and a semiconductor layer 32 and between a drain electrode 42d and the semiconductor layer 32. The source electrode 42s and the drain electrode 42d are made of copper, and the anti-diffusion layer 90 is made of tantalum nitride (TaN). In the illustrated embodiment, the anti-diffusion layer 90 is provided not only under lower surfaces of the source electrode 42s and the drain electrode 42d but also under a lower surface of wiring 44.

Copper (Cu) has the property of easily dispersing in a semiconductor material (e.g., silicon) at a high temperature of several hundred degrees Celsius or above. Therefore, in the case where the source electrode 42s and the drain electrode 42d (second metal layer 40) are made of copper, when the source and drain electrodes 42s and 42d are subjected to a high temperature in fabrication processes, copper atoms constituting the second metal layer 40 may migrate into the semiconductor layer 32. This may cause troubles such as junction leakage of the device and fluctuation in threshold voltage. In the configuration illustrated in FIG. 9, the anti-diffusion layer 90 is provided between the source electrode 42s and the semiconductor layer 32, and between the drain electrode 42d and the semiconductor layer 32, so that the migration of the copper atoms (dispersion into the semiconductor layer 32) can be prevented. That is, it is possible to avoid the above troubles such as the junction leak and the fluctuation in threshold voltage.

As a material for forming the anti-diffusion layer 90, an inorganic compound having an excellent diffusion barrier property with respect to copper and having conductivity can be used. Examples of such an inorganic compound include transition metals such as tantalum (Ta), titanium (Ti), and the like. Alternatively, a transition metal nitride such as a tantalum nitride (e.g., TaN), a titanium nitride (e.g., TiN), or the like may be used. The tantalum nitride has an excellent adhesion property to copper formed by a sputtering method, and has an excellent diffusion barrier property with respect to copper. Thus, the tantalum nitride is particularly preferable as a material for the anti-diffusion layer 90 in the flexible semiconductor device 300 of the present embodiment.

An example fabrication process of the flexible semiconductor device 300 including the anti-diffusion layer 90 will be described with reference to FIGS. 10(a)-10(c), and FIGS. 11(a)-11(c). Note that the same description as that in Embodiment 1 other than matters particularly described in Embodiment 3 will be omitted.

Figure 10:
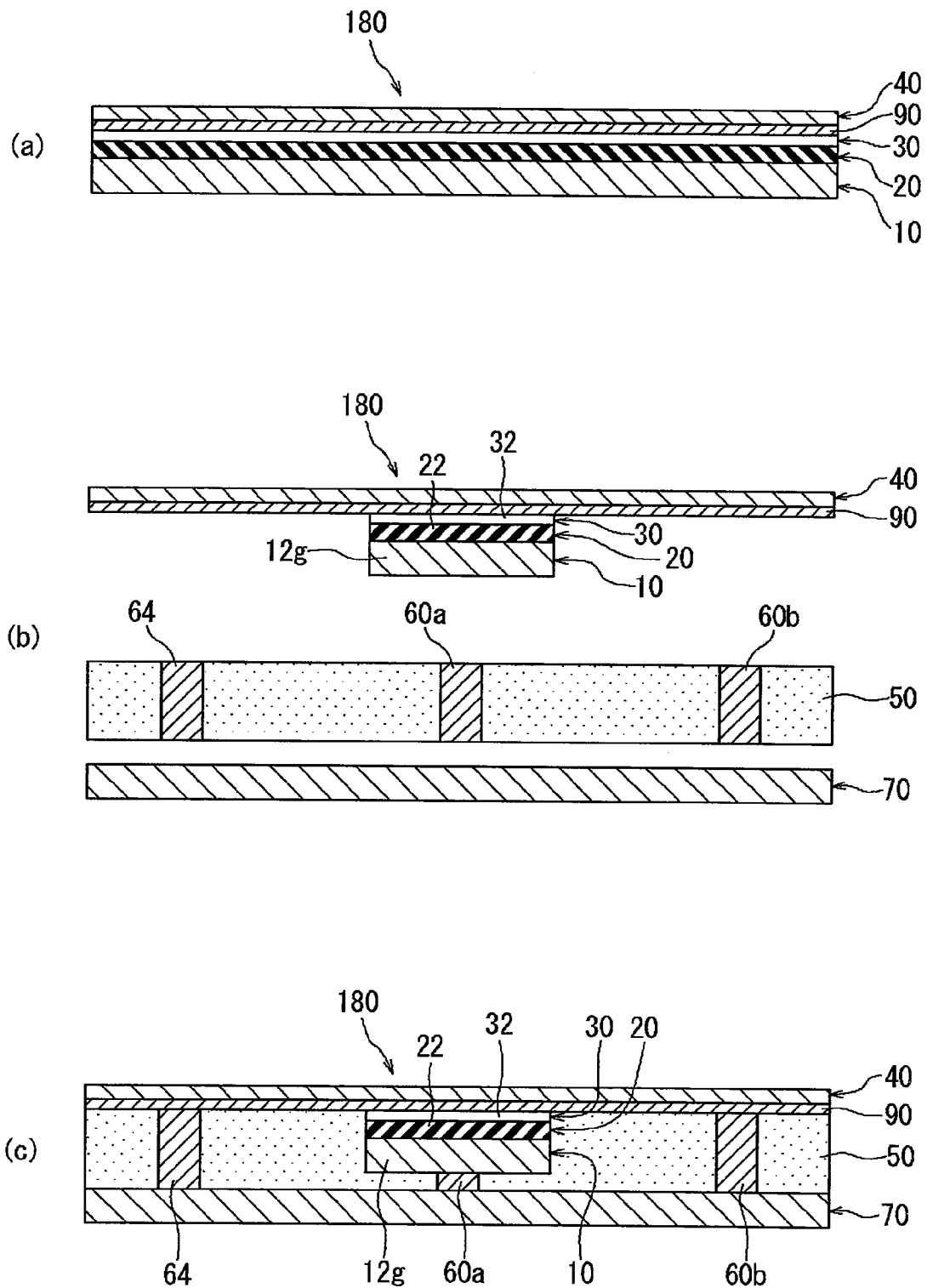
FIGS. 10(a)-10(c) are cross-sectional views illustrating processes for fabricating the flexible semiconductor device according to Embodiment 3 of the present invention.

First, as illustrated in FIG. 10(a), a layered film 180 is prepared, where the layered film 180 includes a first metal layer 10, an inorganic insulating layer 20, a semiconductor layer 30, an anti-diffusion layer 90, and a second metal layer 40 which are sequentially formed. The layered film 180 includes the anti-diffusion layer 90 between the semiconductor layer 30 and the second metal layer 40. The anti-diffusion layer 90 can be formed by, for example, depositing a material for the anti-diffusion layer 90 on the semiconductor layer 30 by a thin film formation process such as a sputtering method, a CVD method, or the like.

Next, as illustrated in FIG. 10(b), one surface of the layered film 180 is etched to pattern a gate electrode 12g, a gate insulating film 22, and a semiconductor layer 32. Specifically, the first metal layer 10 of the layered film 180 is etched to form the gate electrode 12g from the first metal layer 10. Moreover, the inorganic insulating layer 20 and the semiconductor layer 30 are partially removed to pattern the gate insulating film 22 and the semiconductor layer 32.

Next, as illustrated in FIG. 10(c), the layered film 180, a resin sheet 50, and a third metal layer 70 are compression bonded together. The compression bonding allows the gate electrode 12g of the layered film 80 to be embedded in an upper surface of the resin sheet 50.

Figure 11:
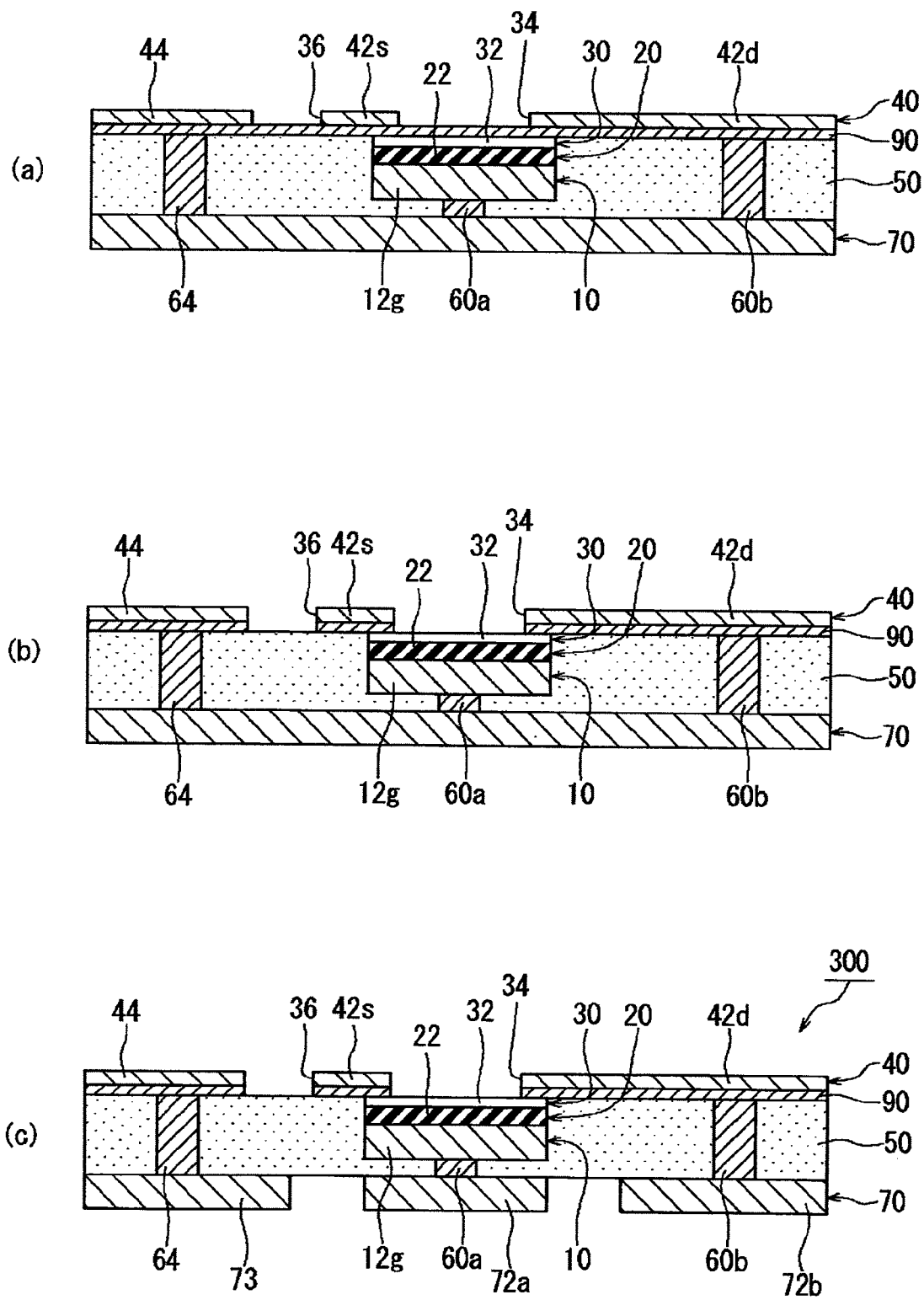
FIGS. 11(a)-11(c) are cross-sectional views illustrating processes for fabricating the flexible semiconductor device according to Embodiment 3 of the present invention.

Next, as illustrated in FIG. 11(a), the second metal layer 40 is partially etched to form source and drain electrodes 42s and 42d, and wiring 44 from the second metal layer 40. In doing so, opening patterns 34 and 36 exposing part of the anti-diffusion layer 90 are formed.

Next, as illustrated in FIG. 11(b), the anti-diffusion layer 90 exposed in the opening patterns 34 and 36 is removed, thereby patterning the anti-diffusion layer 90. A method for removing the anti-diffusion layer 90 is not limited to a particular one, but it is possible to use, for example, an etching method (dry etching or wet etching may be possible) which can be used in a general photolithographic process.

After that, as illustrated in FIG. 11(c), the third metal layer 70 is partially etched to form a wiring layer 72a connected to the gate electrode 12g. In the illustrated embodiment, in addition to the wiring layers 72a and 72b, a wiring layer 73 electrically connected to the wiring 44 through an interlayer connector 64 is formed. The flexible semiconductor device 300 including the anti-diffusion layer 90 can thus be fabricated.

Note that the anti-diffusion layer 90 is provided only to prevent the source electrode 42s and the drain electrode 42d from contacting the semiconductor layer 32. Thus, it is also possible to remove the anti-diffusion layer provided, for example, under a lower surface of the wiring 44. In particular, there may be a case where the anti-diffusion layer between the wiring 44 and the interlayer connector 64 is preferably removed. The anti-diffusion layer 90 can be partially removed, for example, in etching one surface of the layered film 180 illustrated in FIG. 10(b).

Embodiment 4

FIGS. 12(a) and 12(b) illustrate a configuration of a layered film for a flexible semiconductor device according to Embodiment 4 of the present invention. A layered film 280 of Embodiment 4 differs from the layered film 80 of FIG. 6(d) in that an originally patterned semiconductor layer 32 is provided. Such a layered film 280 is manufactured by forming a patterned semiconductor layer 32 on an inorganic insulating layer 20 as illustrated in FIG. 12(a), and subsequently forming a second metal layer 40 on the patterned semiconductor layer 32 as illustrated in FIG. 12(b). The semiconductor layer 32 can be patterned by, for example, a print method such as inkjet. A fabrication process of a flexible semiconductor device 400 using the layered film 280 is illustrated in FIGS. 13(a)-13(d).

Figure 13:
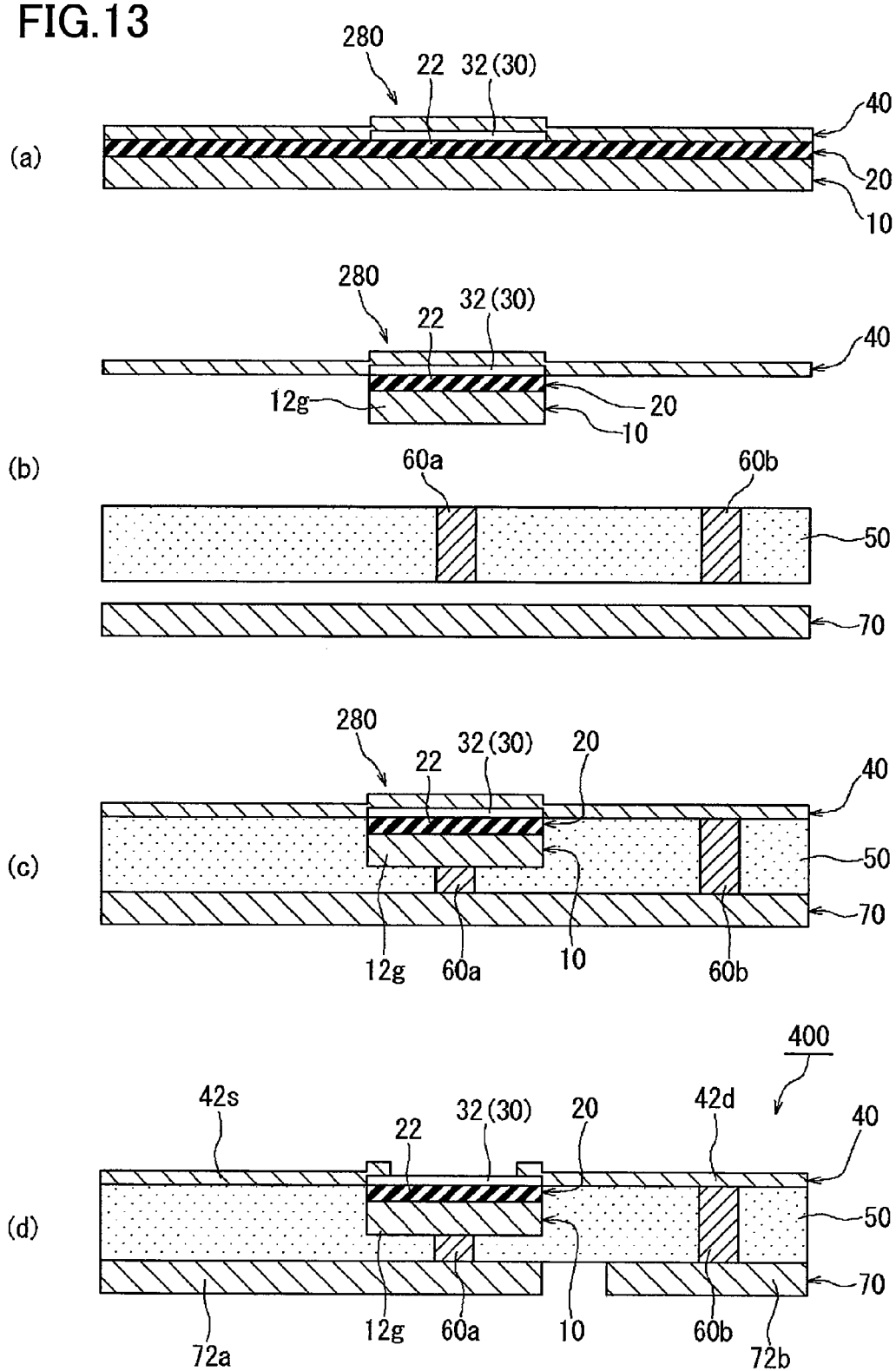
FIGS. 13(a)-(d) are cross-sectional views illustrating processes for fabricating the flexible semiconductor device according to Embodiment 4 of the present invention.

First, as illustrated in FIG. 13(a), the layered film 280 having the patterned semiconductor layer 32 is prepared. Next, as illustrated in FIG. 13(b), a gate electrode 12g and a gate insulating film 22 are formed form the layered film 280. Here, the semiconductor layer 32 has already been patterned, and thus there is no need to pattern the semiconductor layer 32. Then, as illustrated in FIG. 13(c), the layered film 280, a resin sheet 50, and a third metal layer 70 are integrated. As illustrated in FIG. 13(d), a second metal layer 40 and the third metal layer 70 are etched to form source and drain electrodes 42s and 42d and wiring layers 72a and 72b respectively. Processes for fabricating the flexible semiconductor device 400 are thus completed. The layered film 280 having the semiconductor layer 32 patterned in advance is used, so that patterning the semiconductor layer 32 can be omitted. As a result, the fabrication process can become simpler and easier.

Embodiment 5

Figure 14:
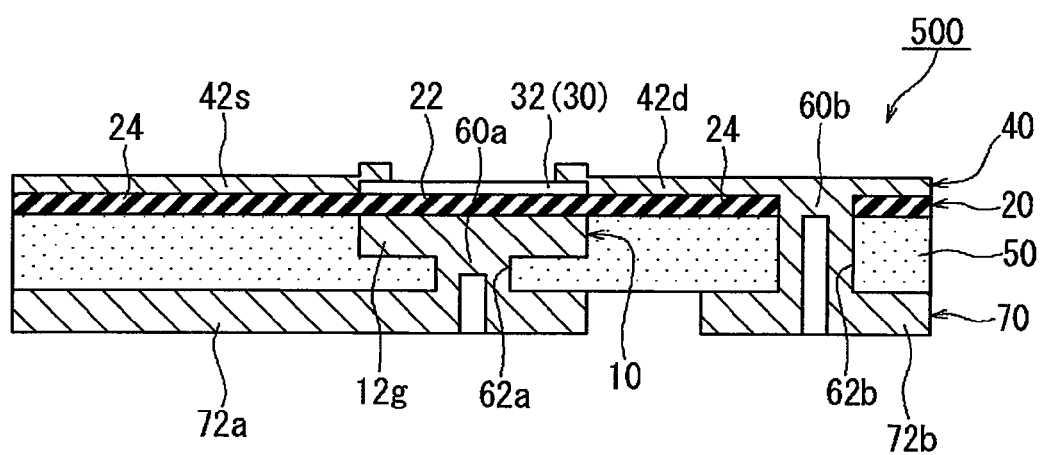
FIG. 14 is a cross-sectional view illustrating a flexible semiconductor device according to Embodiment 5 of the present invention.

FIG. 14 illustrates a configuration of a flexible semiconductor device 500 according to Embodiment 5 of the present invention. Embodiment 5 is different form the above embodiments in that an inorganic insulating layer is formed on the entire surface of a resin sheet 50. That is, an inorganic insulating layer 20 is not patterned, but is provided in a region 24 as well as in a region corresponding to a gate insulating film 22. Processes for fabricating the flexible semiconductor device 500 will be described. Note that in Embodiment 5, interlayer connectors 60a and 60b are plating vias manufactured by a conformal method.

Figure 15:
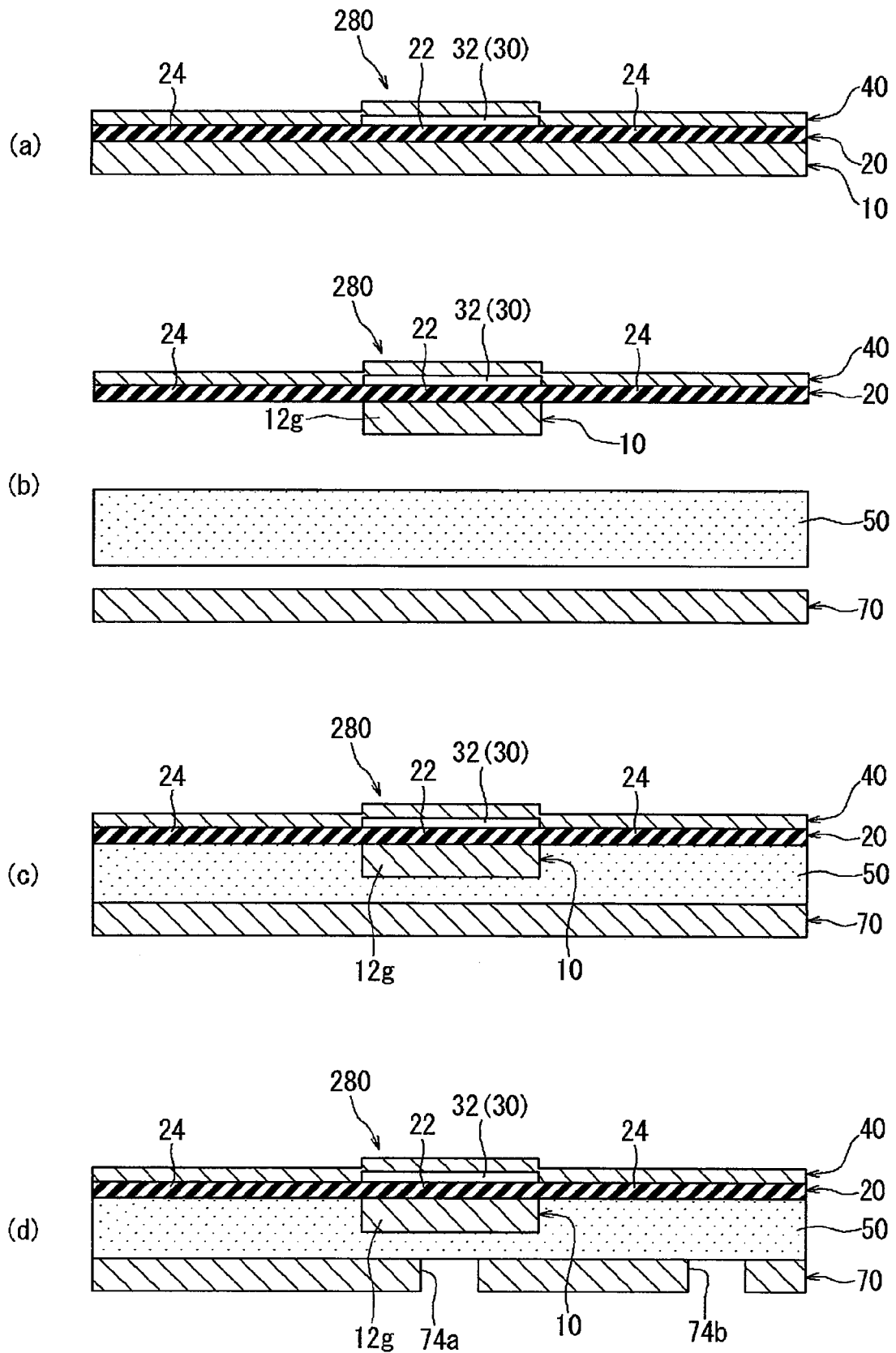
FIGS. 15(a)-15(d) are cross-sectional views illustrating processes for fabricating the flexible semiconductor device according to Embodiment 5 of the present invention.

First, as illustrated in FIG. 15(a), a layered film 280 having a semiconductor layer 30 in a predetermined pattern is prepared. Subsequently, as illustrated in FIG. 15(b), a first metal layer 10 of the layered film 280 is etched to form a gate electrode 12g. Next, as illustrated in FIG. 15(c), a resin sheet 50 and a third metal layer 70 integrated in advance are prepared, and the layered film 280 is compression bonded to the resin sheet 50. Then, the third metal layer 70 is partially etched to form holes 74a and 74b for laser irradiation.

Figure 16:
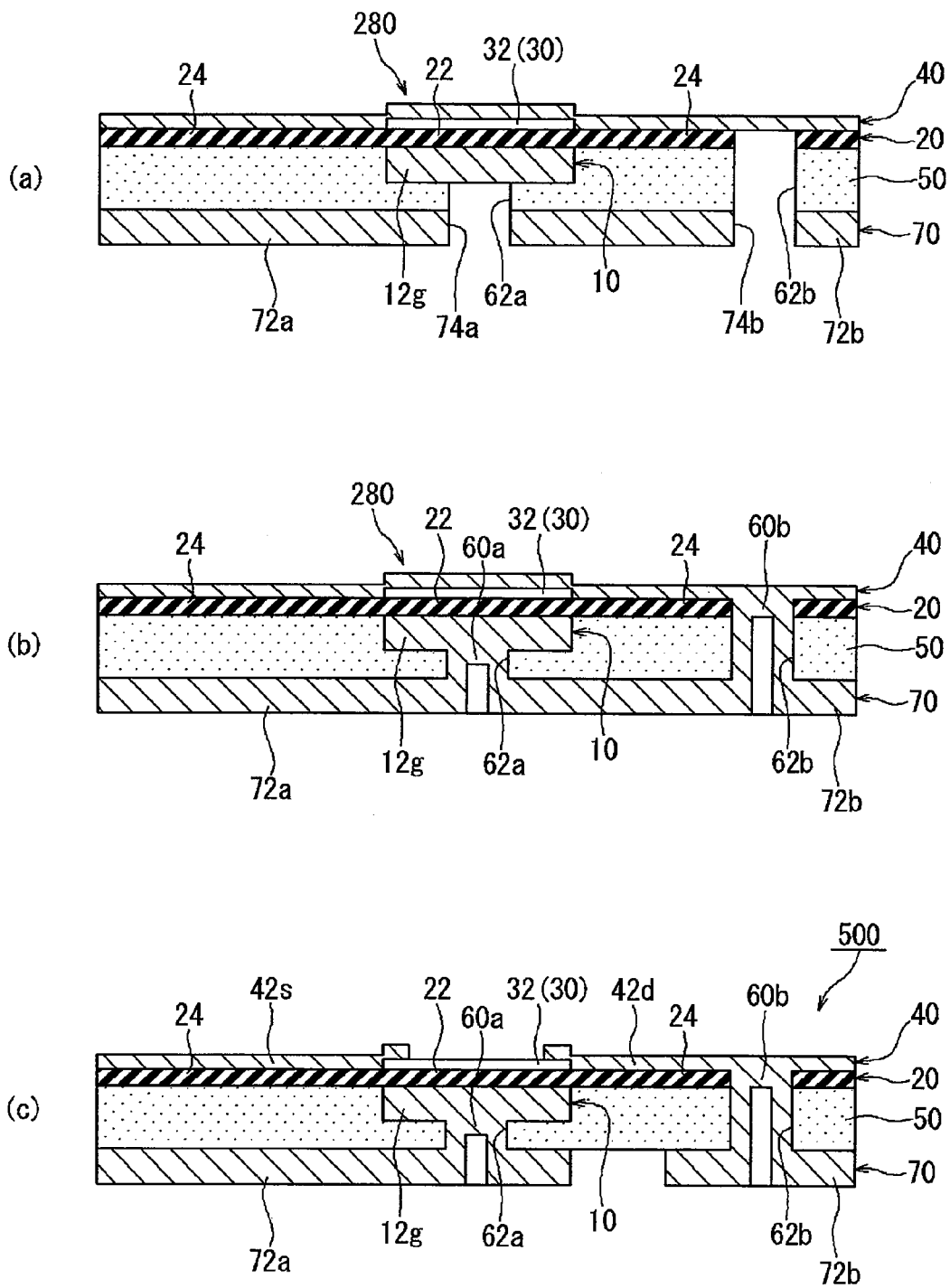
FIGS. 16(a)-16(c) are cross-sectional views illustrating processes for fabricating the flexible semiconductor device according to Embodiment 5 of the present invention.

After the holes 74a and 74b for laser irradiation are formed, laser irradiation is performed using the holes 74a and 74b for laser irradiation as a guide wall as illustrated in FIG. 16(a). The laser irradiation forms openings 62a and 62b through the resin sheet 50 and the inorganic insulating layer 20.

Next, as illustrated in FIG. 16(b), a copper plating process is performed to establish contact with the gate electrode 12g and a second metal layer 40 respectively through the openings 62a and 62b, thereby forming plating vias 60a and 60b.

After that, as illustrated in FIG. 16(c), the second metal layer 40 is etched to form source and drain electrodes 42s and 42d. Moreover, the third metal layer 70 is etched to form wiring layers 72a and 72b. The processes for fabricating the flexible semiconductor device 500 whose insulating layer expands over the entire surface are thus completed. With the fabrication method, patterning of the inorganic insulating layer 20 can be omitted, which further simplify the fabrication process of the flexible semiconductor device 500.

Embodiment 6

Figure 17:
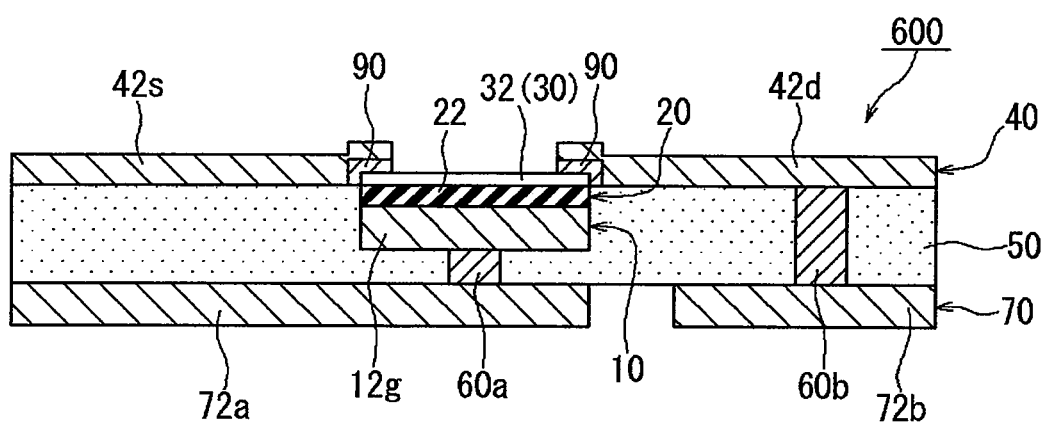
FIG. 17 is a cross-sectional view illustrating a flexible semiconductor device according to Embodiment 6 of the present invention.

FIG. 17 illustrates a configuration of a flexible semiconductor device 600 according to Embodiment 6 of the present invention. Embodiment 6 differs from the embodiment of FIG. 9 in that an anti-diffusion layer 90 is selectively formed only between a semiconductor layer 32 and a source electrode 42s and between the semiconductor layer 32 and a drain electrode 42d. A fabrication process of the flexible semiconductor device 600 will be described with reference to FIGS. 18(a)-18(d).

Figure 18:
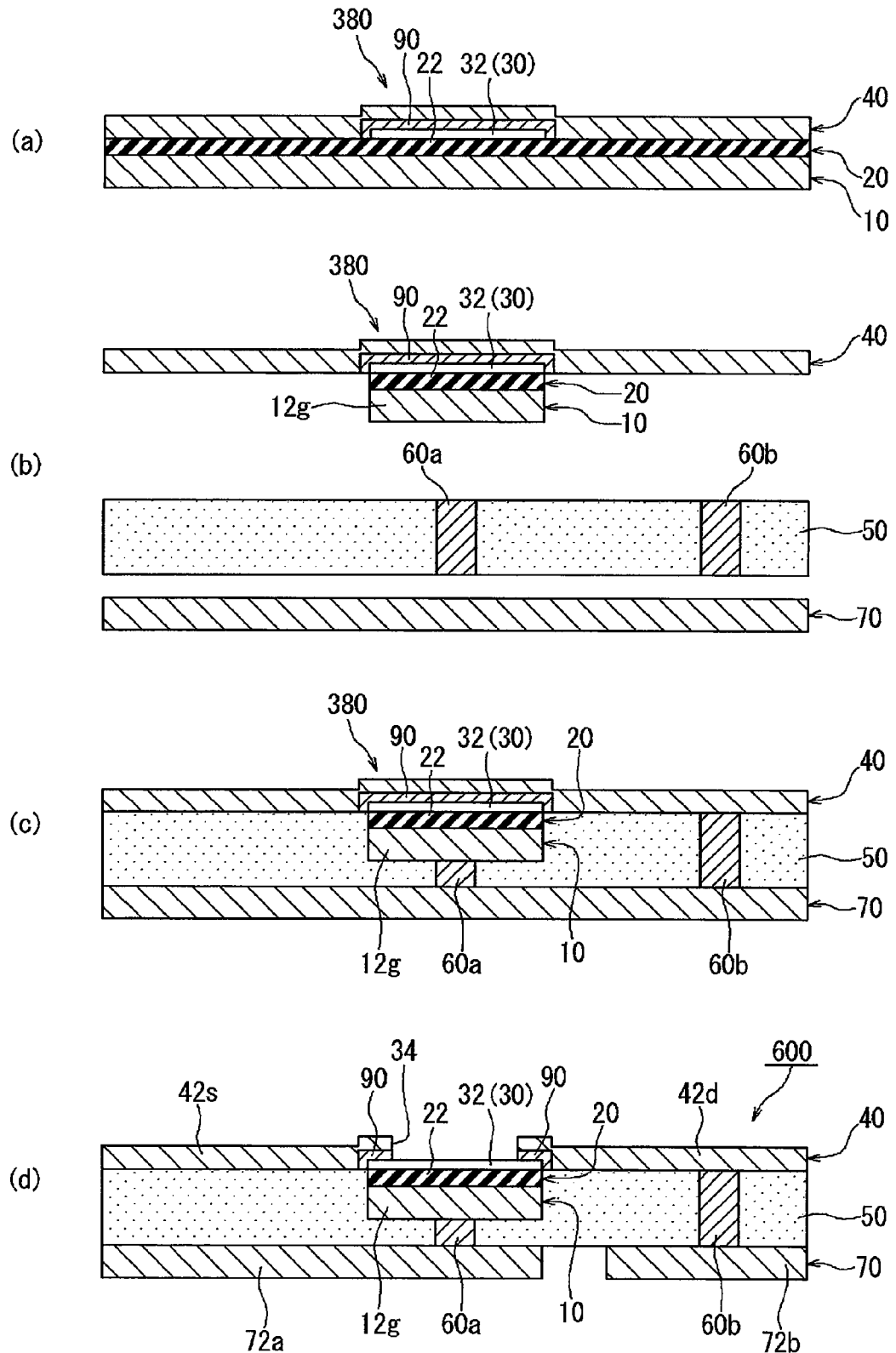
FIGS. 18(a)-18(d) are cross-sectional views illustrating processes for fabricating the flexible semiconductor device according to Embodiment 6 of the present invention.

First, as illustrated in FIG. 18(a), a layered film 380 is prepared. The layered film 380 includes a semiconductor layer 32 patterned in advance. Moreover, between the semiconductor layer 32 and a second metal layer 40, an anti-diffusion layer 90 is provided to cover the patterned semiconductor layer 32.

Next, as illustrated in FIG. 18(b), a first metal layer 10 of the layered film 380 is etched to form a gate electrode 12g. Moreover, an inorganic insulating layer 20 is partially removed to form a gate insulating film 22. Then, as illustrated in FIG. 18(c), the layered film 380, a resin sheet 50, and a third metal layer 70 are compression bonded together.

Next, as illustrated in FIG. 18(d), the second metal layer 40 is partially etched to form a source electrode 42s and a drain electrode 42d, thereby forming an opening 34 in which part of the anti-diffusion layer 90 is exposed. Then, the part of the anti-diffusion layer 90 exposed in the opening 34 is removed, thereby patterning the anti-diffusion layer 90. Moreover, the third metal layer 70 is etched to from wiring layers 72a and 72b. In this way, it is possible to form the flexible semiconductor device 600 having the anti-diffusion layer 90 selectively formed only between the semiconductor layer 32 and the source electrode 42s and between the semiconductor layer 32 and the drain electrode 42d.

Embodiment 7

Subsequently, with reference to FIGS. 19(a) and 19(b), an example embodiment of a flexible semiconductor device 700 which can be preferably mounted to an image display device will be described. FIG. 19(b) is a top view schematically illustrating the flexible semiconductor device 700 according to Embodiment 7 of the present invention. FIG. 19(a) is a cross-sectional view schematically illustrating the flexible semiconductor device 700 along the line A-A of FIG. 19(b).

The flexible semiconductor device 700 configured to be mounted to an image display device (here, an organic EL display) includes at least two TFT elements each including a semiconductor layer, a gate insulating film, a gate electrode, a source electrode, and a drain electrode. Here, the number of TFTs per pixel is two, and the flexible semiconductor device includes a first TFT element 700A and a second TFT element 700B. In Embodiment 7, the first TFT element 700A is a switching transistor, and the second TFT element 700B is a driving transistor.

In the illustrated embodiment, a drain electrode 42Ad of the switching TFT element 700A and a gate electrode 12Bg of the driving TFT element 700B are electrically connected to each other via interlayer connectors 60Ab and 60Ba, and wiring layers 72Ab and 72Ba.

Note that in the configuration of Embodiment 7, part of a source electrode 42As and part of the drain electrode 42Ad are extended on an upper surface of a semiconductor layer 32A. The flexible semiconductor device 700 can be operated without the extended parts 44As and 44Ad.

However, in the illustrated embodiment, the extended part 44As of the source electrode and the extended part 44Ad of the drain electrode facing each other have a comb-like shape. As in this embodiment, the parts of the source electrode 42As and the drain electrode 42Ad facing each other are formed to have a comb-like shape, so that a channel width can be increased while retaining a predetermined dimension. As a result, the increased channel width allows high-speed operation. Note that the length of the comb-like shape can be changed as appropriate according to required TFT performance. For example, the length of the comb-like shape of the driving TFT element 700B can be longer than the length of the comb-like shape of the switching TFT element 700A.

Moreover, the flexible semiconductor device 700 includes a capacitor 92. The capacitor 92 has capacity to drive the driving TFT element 700B. In the illustrated embodiment, the capacitor 92 includes a dielectric layer 94, an upper electrode layer 96, and a lower electrode layer 98.

The dielectric layer 94 of the capacitor 92 is made of the same material as that of gate insulating films 22A and 22B of the elements, and can be formed by partially removing an inorganic insulating layer 20 of a layered film 480 (FIG. 19(a)) which will be described later. Moreover, the upper electrode layer 96 of the capacitor 92 is made of the same material as that of the source electrodes 42As and 42Bs and the drain electrodes 42Ad and 42Bd of the elements, and can be formed by etching a second metal layer 40 of the layered film 480 described later. Furthermore, the lower electrode layer 98 of the capacitor 92 is made of the same material as that of the gate electrodes 12Ag and 12Bg of the elements, and can be formed by etching a first metal layer 10 of the layered film 480 described later.

The lower electrode layer 98 is connected via an interlayer connector 60c to the switching drain electrode 42Ad and the driving gate electrode 12Bg. The upper electrode layer 96 is connected to the driving source electrode 42Bs. Electrical charges are retained during a period selected by the switching TFT element 700A. A voltage caused by the electrical charges is applied to a gate of the driving TFT element 700B, and a drain current according to the voltage flows through an organic EL element to allow a pixel to emit light.

A TFT element for driving a display which is an important application of the flexible semiconductor device requires a capacitor having capacity to drive the element. However, when the capacitor 92 is formed directly in a resin sheet 50 as in the embodiment, it is not necessary to separately provide a capacitor outside the flexible semiconductor device 700. Thus, it is possible to achieve a small-seized image display device which can be densely packaged.

FIG. 19(c) illustrates an equivalent circuit 65 of the structure of FIGS. 19(a) and 19(b). In FIG. 19(c), wiring 66 is a data line, and wiring 68 is a selection line. The flexible semiconductor device 700 of the present embodiment is formed for each pixel of the image display device. Depending on the structure of the display, two or more TFT elements may be provided in each pixel. The flexible semiconductor device 700 of Embodiment 7 can therefore be modified according to the structure of the TFT element.

With reference to FIGS. 20(a)-20(d), a fabrication process of the flexible semiconductor device 700 of FIGS. 19(a) and 19(b) will be described. The capacitor 92 and the first and second TFT elements 700A and 700B of the flexible semiconductor device 700 are simply and easily manufactured by the processes illustrated in FIGS. 20(a)-20(d). That is, processes for fabricating the flexible semiconductor device 700 further include forming the capacitor 92 from a portion of the inorganic insulating layer 20 on which the semiconductor layer 30 is not provided, the first metal layer 10, and the second metal layer 40.

First, as illustrated in FIG. 20(a), a layered film 480 is prepared. The layered film 480 prepared here has patterned semiconductor layers 32A and 32B respectively of the first and second TFT elements 700A and 700B.

Next, as illustrated in FIG. 20(b), a first metal layer 10 of the layered film 480 is etched to form gate electrodes 12Ag and 12Bg, and to form a lower electrode layer 98 of a capacitor. Moreover, an inorganic insulating layer 20 of the layered film 480 is partially removed to from gate insulating films 22A and 22B, and to form a dielectric layer 94 of the capacitor.

Next, as illustrated in FIG. 20(c), the layered film 480, a resin sheet 50, and a third metal layer 70 are compression bonded together. At this time, the lower electrode layer 98 of the capacitor and an interlayer connector 60c are positioned to contact with each other, and the lower electrode layer 98 and the interlayer connector 60c are connected to each other.

Next, as illustrated in FIG. 20(d), a second metal layer 40 is etched to form source electrodes 42As and 42Bs, drain electrodes 42Ad and 42Bd, and an upper electrode layer 96 of the capacitor. After that, the third metal layer 70 is etched to form wiring layers 72Aa, 72Ab, and 72Ba. In this way, the flexible semiconductor device 700 including the capacitor 92 can be obtained.

Although preferred embodiments of the present invention have been described above, the above description does not limit the present invention to those details, and thus, various modifications can be made. For example, depending on the configuration of a display, two or more TFT elements may be provided in each pixel. Therefore, the flexible semiconductor device of the embodiments may be modified according to configuration of the display. Moreover, the above embodiments show an example in which the flexible semiconductor device is fabricated in a manner corresponding to a single device. However, the present invention is not limited to this, and a method for fabricating the flexible semiconductor device in a manner corresponding to a plurality of devices may be performed. A roll-to-roll method can be used as such a fabrication method.

INDUSTRIAL APPLICABILITY

The method for fabricating the flexible semiconductor device of the present invention can provide a high-performance, flexible semiconductor device having excellent productivity.

DESCRIPTION OF REFERENCE CHARACTERS

10 First Metal Layer
12g Gate Electrode
20 Inorganic Insulating Layer
22 Gate Insulating Film
26 Opening for Interlayer Connector (Inorganic Insulating Layer)
30 Semiconductor Layer (before patterning)
32 Semiconductor Layer (after patterning)
34 Opening (Second Metal Layer)
40 Second Metal Layer
42d Drain Electrode
42s Source Electrode
44Ad, 44Bd Extended Part (Drain Electrode)
44As, 44Bs Extended Part (Source Electrode)
50 Resin Sheet (Resin Layer)
60a, 60b, 60c Interlayer Connector
62a, 62b Opening
65 Equivalent Circuit
66, 68 Wiring
70 Third Metal Layer
72a, 72b Wiring layer
80 Layered Film
90 Anti-Diffusion Layer
92 Capacitor
94 Dielectric Layer
96 Upper Electrode Layer
98 Lower Electrode Layer
100 Flexible Semiconductor Device

The invention claimed is:

1. A method for fabricating a flexible semiconductor device having a thin film transistor, the method comprising:
   (a) preparing a layered film including a first metal layer, an inorganic insulating layer, a semiconductor layer, and a second metal layer which are sequentially formed;
   (b), after step (a), partially etching the first metal layer to form a gate electrode made of the first metal layer; and
   (c), after step (a), partially etching the second metal layer to form a source electrode and a drain electrode made of the second metal layer, wherein
   the inorganic insulating layer on the gate electrode functions as a gate insulating film, and
   the semiconductor layer between the source electrode and the drain electrode on the inorganic insulating layer functions as a channel.

2. The method of claim 1, further comprising:
   after step (b) and before step (c), (d) compression bonding a resin layer to a surface of the layered film provided with the gate electrode to allow the gate electrode to be embedded in the resin layer.

3. The method of claim 2, wherein in step (d), the resin layer is made of a resin sheet.

4. The method of claim 2, wherein step (d) includes
   preparing the resin layer in which a plurality of interlayer connectors extending from one surface to the other surface of the resin layer is formed, and
   compression bonding the layered film provided with the gate electrode to the resin layer to connect the interlayer connectors in the resin layer to the gate electrode.

5. The method of claim 4, wherein the interlayer connectors are paste vias.

6. The method of claim 2, comprising: after step (d),
   partially etching a surface of the resin layer to form an opening in which the gate electrode is exposed; and
   forming a plating layer on the surface of the resin layer including at least the opening, where the plating layer is electrically connected to the gate electrode.

7. The method of claim 2, further comprising:
   after step (b), removing the inorganic insulating layer by etching such that the inorganic insulating layer is left at least in a region including the gate insulating film.

8. The method of claim 7, further comprising:
   after step (b), removing the semiconductor layer by etching such that the semiconductor layer is left at least in a region including the channel.

9. The method of claim 8, further comprising:
   after step (d), compression bonding a third metal layer on a surface of the resin layer, and then etching the third metal layer to form a wiring layer, wherein
   the wiring layer is connected via the interlayer connectors to the source electrode and the drain electrode and/or the second metal layer.

10. The method of claim 1, wherein in step (a), an anti-diffusion layer is further provided between the semiconductor layer and the second metal layer.

11. The method of claim 7, wherein in step (a), the semiconductor layer is patterned in advance at least in a region including the channel.

12. The method of claim 11, wherein
in step (b), the first metal layer is partially etched to form a lower electrode of a capacitor simultaneously with forming the gate electrode, where the lower electrode is made of the first metal layer,
in step (c), the second metal layer is partially etched to form an upper electrode of the capacitor simultaneously with forming the source electrode and the drain electrode, where the upper electrode is made of the second metal layer, and
the inorganic insulating layer between the upper electrode and the lower electrode functions as a dielectric layer of the capacitor.

\* \* \* \* \*